United States Patent
Lee et al.

(10) Patent No.: US 11,009,979 B2
(45) Date of Patent: May 18, 2021

(54) TOUCHSCREEN PANEL AND TOUCH DISPLAY DEVICE INCLUDING THE SAME

(71) Applicant: LG DISPLAY CO., LTD., Seoul (KR)

(72) Inventors: JaeGyun Lee, Gyeonggi-do (KR); Sangkyu Kim, Gyeonggi-do (KR); JiHyun Jung, Gyeonggi-do (KR); DeukSu Lee, Gyeonggi-do (KR); Jaeseung Kim, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 90 days.

(21) Appl. No.: 16/172,485

(22) Filed: Oct. 26, 2018

(65) Prior Publication Data

US 2019/0129552 A1 May 2, 2019

(30) Foreign Application Priority Data

Oct. 27, 2017 (KR) .................. 10-2017-0141518

(51) Int. Cl.
| | |
|---|---|
| *G06F 3/041* | (2006.01) |
| *G06F 3/044* | (2006.01) |
| *H01L 27/32* | (2006.01) |
| *G09G 3/3275* | (2016.01) |
| *G09G 3/3266* | (2016.01) |
| *H01L 51/56* | (2006.01) |
| *H01L 51/52* | (2006.01) |
| *G09G 3/3233* | (2016.01) |

(52) U.S. Cl.
CPC .......... *G06F 3/0412* (2013.01); *G06F 3/0416* (2013.01); *G06F 3/0443* (2019.05); *G06F 3/0446* (2019.05); *G06F 3/04164* (2019.05); *G09G 3/3266* (2013.01); *G09G 3/3275* (2013.01); *H01L 27/3246* (2013.01); *H01L 51/5203* (2013.01); *H01L 51/5237* (2013.01); *H01L 51/56* (2013.01); *G06F 2203/04112* (2013.01); *G09G 3/3233* (2013.01); *G09G 2310/0264* (2013.01); *H01L 27/323* (2013.01)

(58) Field of Classification Search
CPC .................................. G06F 3/041; G06F 3/044
See application file for complete search history.

(56) References Cited

U.S. PATENT DOCUMENTS

| | | | |
|---|---|---|---|
| 2015/0309634 A1* | 10/2015 | Lee ...................... | G06F 3/0412 345/173 |
| 2017/0192582 A1* | 7/2017 | Pan ....................... | G06F 3/0416 |
| 2017/0205913 A1* | 7/2017 | Kimura ................. | G06F 3/0416 |
| 2017/0262109 A1* | 9/2017 | Choi ....................... | H01L 51/56 |
| 2018/0107315 A1* | 4/2018 | Lee ................... | G02F 1/136286 |
| 2018/0308903 A1* | 10/2018 | Jeong ................... | H01L 27/323 |
| 2018/0314371 A1* | 11/2018 | Jin .......................... | G06F 3/044 |
| 2018/0350318 A1* | 12/2018 | Lee .......................... | G09G 3/20 |

* cited by examiner

*Primary Examiner* — Chanh D Nguyen
*Assistant Examiner* — Nguyen H Truong
(74) *Attorney, Agent, or Firm* — Birch, Stewart, Kolasch & Birch LLP

(57) ABSTRACT

A touchscreen panel and a touch display device including the same are discussed. A plurality of touch lines disposed on the touchscreen panel include first touch lines and second touch lines. A portion or entirety of each of first touch lines connected to the first touch electrodes overlaps a corresponding one of second touch lines connected to the second touch electrodes. The degree of opening of the touchscreen panel is not lowered by the touch lines.

21 Claims, 29 Drawing Sheets

TOUCHSCREEN PANEL AND TOUCH DISPLAY DEVICE INCLUDING THE SAME

CROSS REFERENCE TO RELATED APPLICATION

This application claims priority to Korean Patent Application No. 10-2017-0141518, filed on Oct. 27, 2017, which is hereby incorporated by reference for all purposes as if fully set forth herein.

BACKGROUND

Field

The present disclosure relates to a touchscreen panel and a touch display device including the same.

Description of Related Art

In response to the development of the information society, demand for a variety of display devices for displaying images is increasing. In this regard, a range of display devices, such as liquid crystal display (LCD) devices, plasma display devices, and organic light-emitting diode (OLED) display devices, have recently come into widespread use.

Among such display devices, touch display devices provide touch-based user interfaces enabling users to intuitively and conveniently input data or instructions directly to devices, rather than using conventional data input systems, such as buttons, a keyboard, or a mouse.

To provide such touch-based user interfaces, touch display devices must be able to sense a touch performed by a user and accurately determine touch coordinates.

In this regard, among a variety of touch sensing methods, capacitance touch sensing is commonly used to sense a touch and to determine touch coordinates using a plurality of touch electrodes, based on a change in capacitance between the touch electrodes.

In a touch display device of the related art, when a display panel is a touchscreen panel, touch lines connected to touch electrodes can disadvantageously lower the degree of opening of the touch display device.

In particular, a large size touch display device must be provided with a plurality of touch electrodes and a plurality of touch lines connected to the plurality of touch electrodes, respectively, to have high touch sensitivity. However, increases in the number of the touch lines can lower the degree of opening of the touch display device, thereby making it difficult to provide a large size touch display device, which is problematic.

In addition, in a large size touch display device, the length of touch lines disposed on the touchscreen panel can be increased by an increase in the area of the touchscreen panel of the touch display device. This can disadvantageously increase the resistance of the touch lines.

BRIEF SUMMARY

Various aspects of the present disclosure provide a touchscreen panel in which a plurality of touch lines, connected to a plurality of touch electrodes, are disposed so as not to reduce the degree of opening of the touchscreen panel, and a touch display device including the same.

Also provided are a touchscreen panel having a structure able to improve touch sensitivity, and a touch display device including the same.

Also provided are a touchscreen panel having a structure able to reduce the resistance of touch lines, and a touch display device including the same.

According to an aspect of the present disclosure, a touch display device can include a plurality of touch electrodes, a panel on which the plurality of touch electrodes are disposed, and a touch sensing circuit sensing a touch or a touched position by driving the panel.

The plurality of touch electrodes can be respectively connected to the touch sensing circuit through at least one touch line.

The plurality of touch electrodes can include first touch electrodes and second touch electrodes.

A portion or entirety of each of first touch lines connected to the first touch electrodes can overlap a corresponding one of second touch lines connected to the second touch electrodes.

The first touch electrodes can be located closer to the touch sensing circuit than the second touch electrodes The first touch lines can be shorter than the second touch lines.

The first touch electrodes and the second touch electrodes can be located on a same touch electrode layer. The first touch lines and the second touch lines can be located on different layers, with an insulating layer being disposed between first touch lines and the second touch lines The touch display device can further include additional touch lines located on a same layer as the first touch lines to be spaced apart from the first touch line. The additional touch lines can be connected to the second touch electrodes.

The additional touch lines can overlap the second touch lines.

Each of the first touch lines and the second touch lines can be disposed between adjacent subpixels among the plurality of subpixels.

According to another aspect of the present disclosure, a plurality of touch electrodes, as well as a plurality of touch lines connected to the plurality of touch electrodes in a corresponding manner, can be provided.

The plurality of touch electrodes can include first touch electrodes and second touch electrodes.

A portion or entirety of each of first touch lines connected to the first touch electrodes can overlap a corresponding one of second touch lines connected to the second touch electrodes.

First touch pads connected to the first touch lines and second touch pads connected to the second touch lines can be located in a peripheral area.

A distance between the first touch lines and the first touch pads can be shorter than a distance between the second touch lines and the second touch pads.

The first touch pads and the second touch pads can be located on a same layer in the peripheral area. One of the first touch lines and the second touch lines can be connected to a corresponding one of the touch pads through a patterned connector or a contact-hole provided on or in a different layer.

According to exemplary embodiments, a touchscreen panel in which a plurality of touch lines, connected to a plurality of touch electrodes, are disposed so as not to reduce the degree of opening of the touchscreen panel, and a touch display device including the same, can be provided.

According to other exemplary embodiments as set forth above, a touchscreen panel having a structure able to improve touch sensitivity, and a touch display device including the same, can be provided.

According to other exemplary embodiments as set forth above, a touchscreen panel having a structure able to reduce the resistance of touch lines, and a touch display device including the same, can be provided.

BRIEF DESCRIPTION OF THE DRAWINGS

The above and other objects, features, and advantages of the present disclosure will be more clearly understood from the following detailed description when taken in conjunction with the accompanying drawings, in which.

DETAILED DESCRIPTION OF THE EMBODIMENTS

Figure 1:
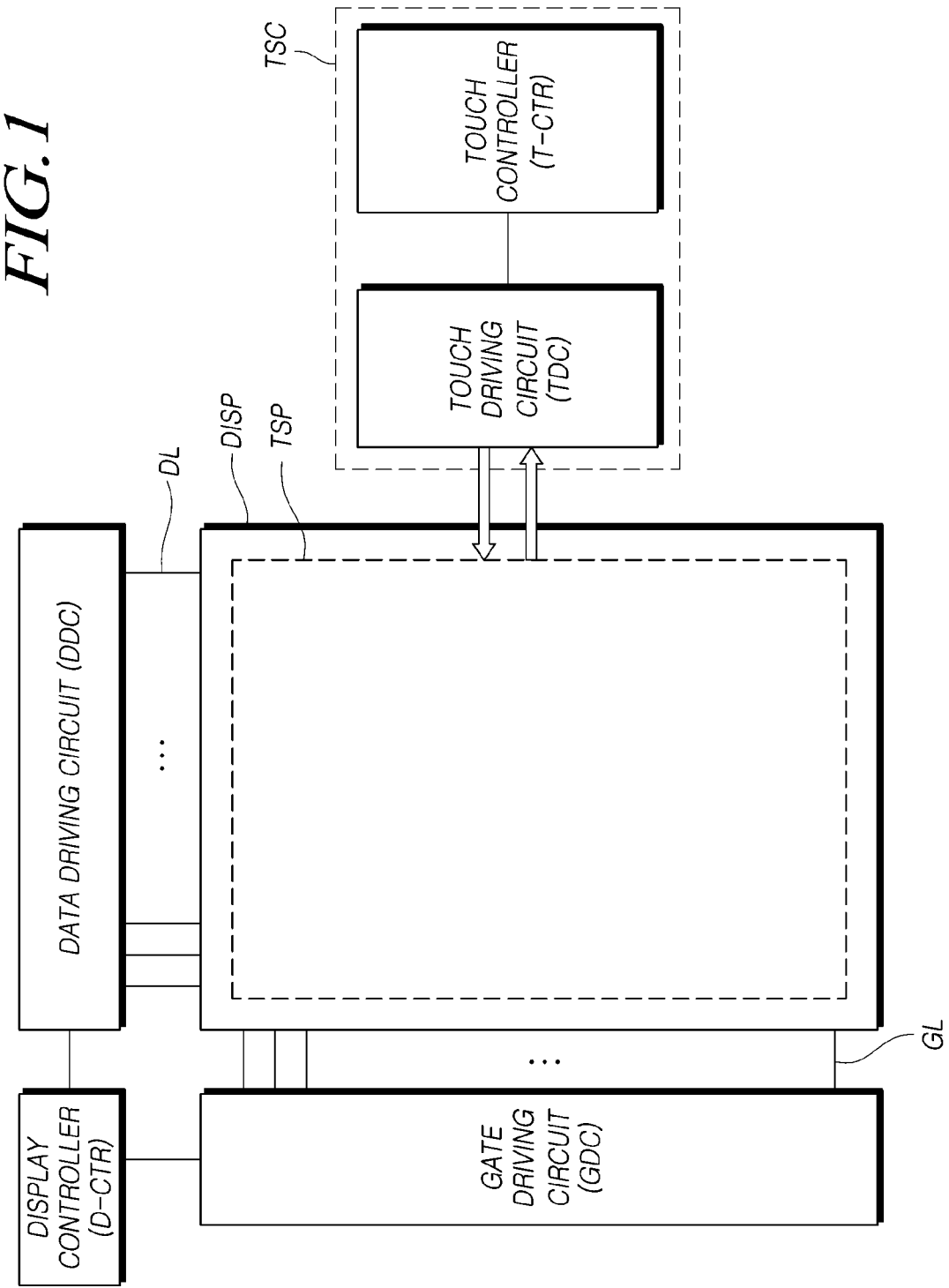
FIG. 1 is a block diagram illustrating a system configuration of a touch display device according to exemplary embodiments.

Hereinafter, reference will be made to embodiments of the present disclosure in detail, examples of which are illustrated in the accompanying drawings. Throughout this document, reference should be made to the drawings, in which the same reference numerals and symbols will be used to designate the same or like components. In the following description of the present disclosure, detailed descriptions of known functions and components incorporated herein will be omitted in the case that the subject matter of the present disclosure can be rendered unclear thereby.

It will also be understood that, while terms such as "first," "second," "A," "B," "(a)," and "(b)" can be used herein to describe various elements, such terms are merely used to distinguish one element from other elements. The substance, sequence, order, or number of such elements is not limited by these terms. It will be understood that when an element is referred to as being "connected, coupled, or joined" to another element, not only can it be "directly connected, coupled, or joined" to the other element, but it can also be "indirectly connected, coupled, or joined" to the other element via an "intervening" element.

In the same context, it will be understood that when an element is referred to as being formed "on" or "above" another element, not only can it be directly located on or under another element, but it can also be indirectly located on or above another element via an intervening element or layer. In contrast, it will be understood that when an element is referred to as being formed "directly on" or "directly above" another element, the element can be directly located on or above another element without an intervening element or layer.

Spatially relative terms such as "below," "beneath," "under," "lower," "above," and "upper" can be used herein for the ease of description of the relationship of an element or components to another element or other components as illustrated in the drawings. Such spatially relative terms should be construed as terms encompassing different orientations of the element in use or operation in addition to the orientation depicted in the drawings. For example, when elements illustrated in the drawings are inverted, an element described as "below," "beneath," or "under" another element would then be oriented "above" the other element. Thus, the example term "below," "beneath," or "under" can encompass both orientations of above and below.

It will also be understood that, while terms such as "first," "second," "A," "B," "(a)," and "(b)" can be used herein to describe various elements, such terms are merely used to distinguish one element from other elements. The substance, sequence, order, or number of such elements is not limited by these terms.

FIG. 1 is a block diagram illustrating a system configuration of a touch display device according to exemplary embodiments. All the components of the touch display device according to all embodiments of the present disclosure are operatively coupled and configured.

Referring to FIG. 1, the touch display device according to exemplary embodiments can provide an image display function to display images and a touch sensing function to sense a touch performed by a user.

The touch display device according to exemplary embodiments can include a display panel DISP on which data lines and gate lines are disposed, a display driving circuit driving the display panel DISP, and the like, in order to display images.

The display driving circuit can include a data driving circuit DDC driving data lines, a gate driving circuit GDC driving gate lines, a display controller D-CTR controlling the data driving circuit DDC and the gate driving circuit GDC, and the like.

The touch display device according to exemplary embodiments can include a touchscreen panel TSP, a touch sensing circuit TSC, and the like, for touch sensing. A plurality of touch electrodes TE acting as touch sensors are disposed on the touchscreen panel TSP. The touch sensing circuit TSC drives the touchscreen panel TSP and performs touch-sensing.

The touch sensing circuit TSC supplies a driving signal to the touchscreen panel TSP to drive the touchscreen panel TSP, detects a sensing signal from the touchscreen panel TSP, and based on the detected sensing signal, senses a touch and/or a determines touched position (i.e., touch coordinates).

The touch sensing circuit TSC can include a touch driving circuit TDC supplying a driving signal and receiving a sensing signal, a touch controller T-CTR calculating a touch and/or touched position (i.e., touch coordinates), and the like.

The touch sensing circuit TSC can be provided as one or more components, for example, integrated circuits (ICs), and can be provided separately from the display driving circuit.

In addition, a portion or the entirety of the touch sensing circuit TSC can be integrated with the display driving circuit or one or more internal circuits of the display driving circuit. For example, the touch driving circuit TDC of the touch sensing circuit TSC can be provided as an IC together with the data driving circuit DDC of the display driving circuit.

The touch display device according to exemplary embodiments can sense a touch based on capacitance created in the touch electrodes TE.

The touch display device according to exemplary embodiments can sense a touch using a self-capacitance-based touch sensing method.

Figure 2:
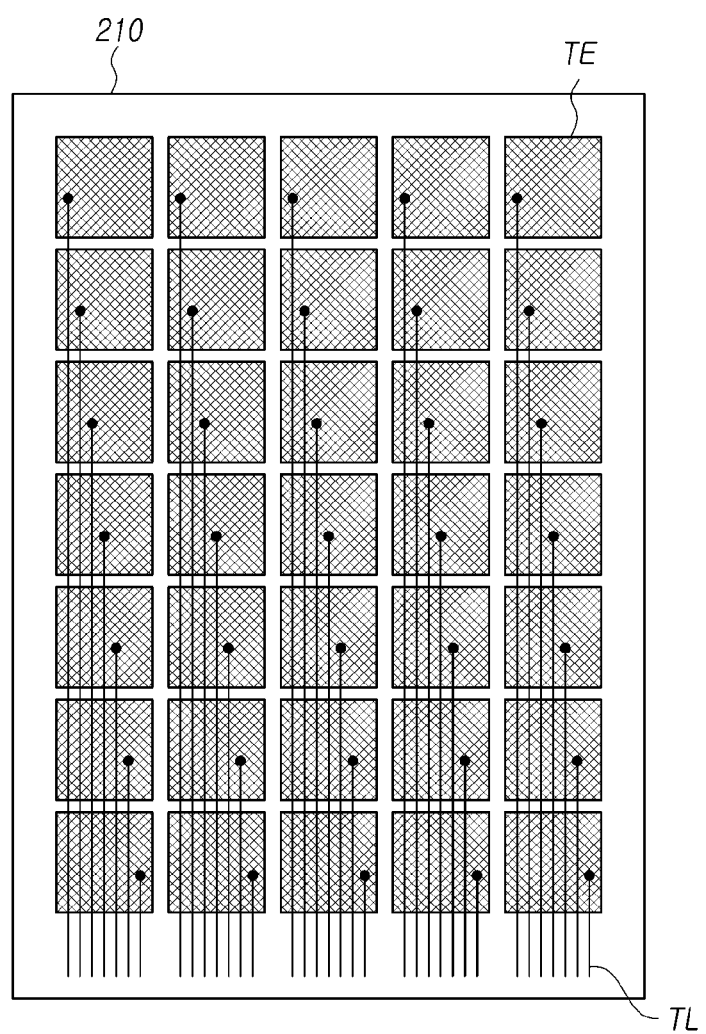
FIG. 2 illustrates an exemplary touchscreen panel in the case in which the touch display device according to exemplary embodiments senses a touch using a self-capacitance-based touch sensing method.

FIG. 2 illustrates an exemplary touchscreen panel TSP in the case in which the touch display device according to exemplary embodiments senses a touch using a self-capacitance-based touch sensing method.

Referring to FIG. 2, in the case of the self-capacitance-based touch sensing method, each of touch electrodes TE, disposed on the touchscreen panel TSP, acts as both a driving touch electrode (applying a driving signal) and a sensing touch electrode (detecting a sensing signal).

That is, a driving signal is applied to each of the touch electrodes TE, and a sensing signal is received through the touch electrode TE to which the driving signal is applied. Accordingly, in the self-capacitance-based touch sensing method, the driving electrode and the sensing electrode are indistinguishable.

In the self-capacitance-based touch sensing method, the touch sensing circuit TSC applies a driving signal to one or more touch electrodes TE, receives sensing signals from the touch electrodes TE to which the driving signal is applied, and senses a touch and/or determines touch coordinates, based on a change in capacitance between a pointer, such as a finger or a pen (e.g., a stylus), and the touch electrodes TE, using the received sensing signals.

Referring to FIG. 2, each of the plurality of touch electrodes TE is electrically connected to the touch driving circuit TDC via one or more touch electrodes TE to transfer a driving signal and a sensing signal.

As described above, the touch display device according to exemplary embodiments can sense a touch using a mutual-capacitance-based touch sensing method or a self-capacitance-based touch sensing method.

In the touch display device according to exemplary embodiments, the touchscreen panel TSP can be a built-in touchscreen panel, fabricated simultaneously with fabrication of the display panel to be present within the display panel. This can consequently reduce the thickness and weight of the touch display device. The plurality of touch electrodes TE and the plurality of touch lines TL are electrodes and signal lines present within the display panel.

The display panel DISP of the touch display device according to exemplary embodiments can have various types, such as an organic light-emitting diode (OLED) panel and a liquid crystal display (LCD) panel. Hereinafter, the display panel will mainly be described as being an OLED panel, for the sake of brevity.

Figure 3:
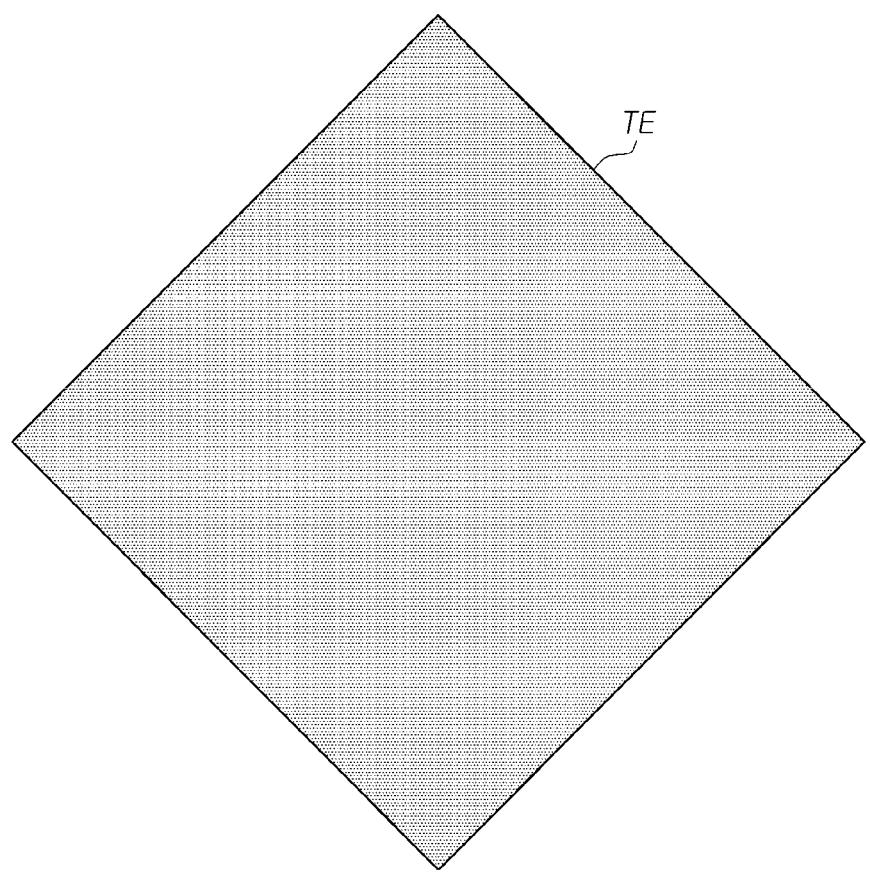
FIG. 3 illustrates a non-mesh-type touch electrode disposed on the touchscreen panel TSP in the touch display device according to exemplary embodiments.

FIG. 3 illustrates a non-mesh-type touch electrode TE disposed on the touchscreen panel TSP in the touch display device according to exemplary embodiments.

Referring to FIG. 3, in the touch display device according to exemplary embodiments, each of a plurality of touch electrodes TE disposed on the touchscreen panel TSP can be a non-mesh-type touch electrode.

The non-mesh-type touch electrode TE can be a plate-shaped electrode metal without an open area.

In this case, the touch electrode TE can be a transparent electrode. When the plurality of touch electrodes TE are bulk electrodes as described above, the plurality of touch electrodes TE can be provided as transparent electrodes to improve the luminous efficiency of the display panel.

Figure 4:
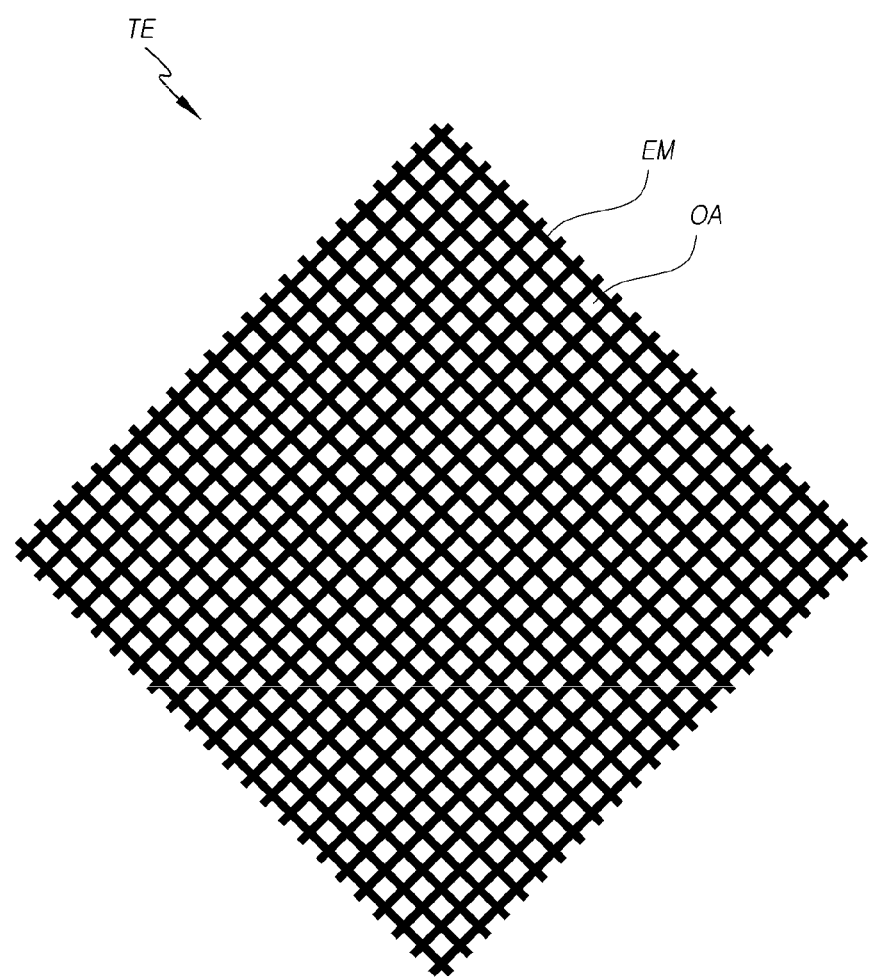
FIG. 4 illustrates a mesh-type touch electrode disposed on the touchscreen panel in the touch display device according to exemplary embodiments.

FIG. 4 illustrates a mesh-type touch electrode disposed on the touchscreen panel in the touch display device according to exemplary embodiments.

Referring to FIG. 4, in the touch display device according to exemplary embodiments, each of the plurality of touch electrodes TE disposed on the touchscreen panel TSP can be a mesh-type touch electrode.

The mesh-type touch electrode TE can be provided as an electrode metal EM patterned into the shape of a mesh.

Accordingly, a plurality of open areas OA can be present in the area of the mesh-type touch electrode TE.

Figure 5:
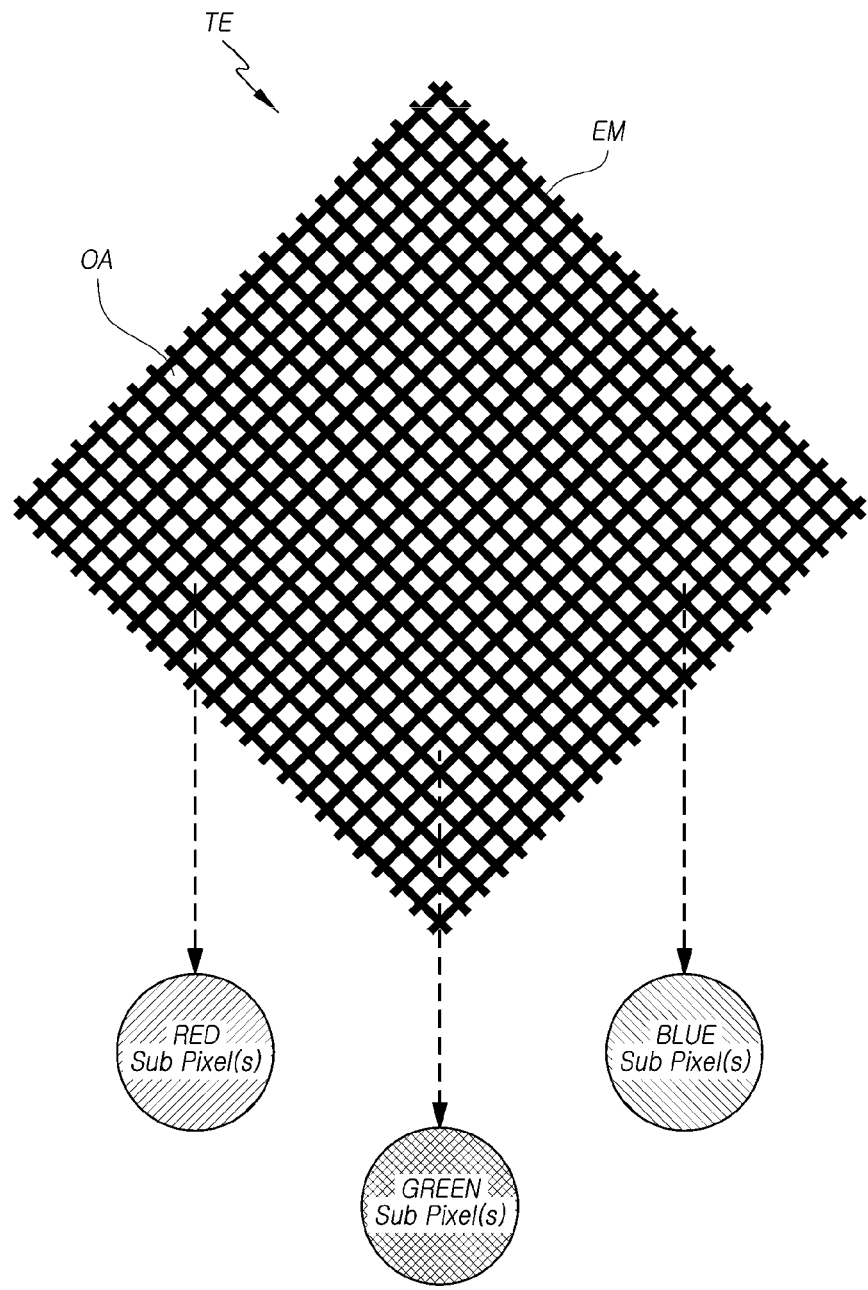
FIG. 5 illustrates a corresponding relationship between the mesh-type touch electrode and subpixels disposed on the touchscreen panel in the touch display device according to exemplary embodiments.

FIG. 5 illustrates the corresponding relationship between the mesh-type touch electrode TE and subpixels disposed on the touchscreen panel TSP in the touch display device according to exemplary embodiments.

Referring to FIG. 5, each of the plurality of open areas OA, present within the area of the touch electrode TE provided as the electrode metal EM patterned into the shape of a mesh, can correspond to one or more emission areas of subpixels.

In an example, each of the plurality of open areas OA, present in the area of each touch electrode TE, can correspond to one or more emission areas of red, green, and blue subpixels.

In another example, each of the plurality of open areas, present within the area of each touch electrode TE, can correspond to one or more emission areas of red, green, blue, and white subpixels.

As described above, one or more emission areas of subpixels being present in each of the open areas OA of the touch electrode TE, when viewed on the plane, can further improve the degree of opening and luminous efficiency of the display panel DISP while enabling touch sensing.

As described above, the outline of each touch electrode TE can be approximately a rhombus, a rectangle (including a square), or the like. The open areas OA, corresponding to holes in the touch electrode TE, can have a shape of a rhombus, a rectangle (including a square), or the like.

However, the shape of the touch electrode TE, as well as the shape of the open areas OA, can be variously modified when designed, in consideration of the shape of the subpixels, the arrangement structure of the subpixels, touch sensitivity, and the like.

Figure 6:
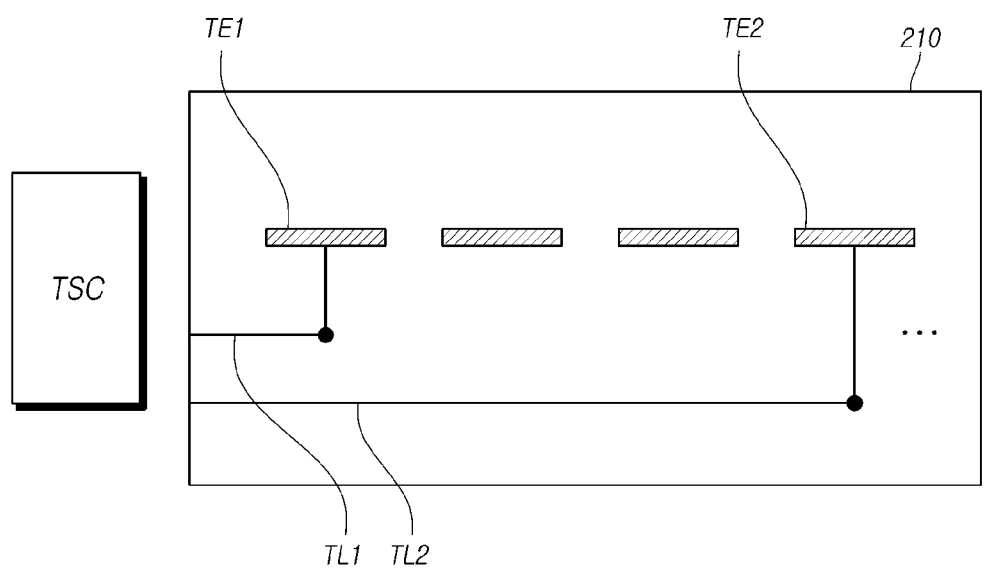
FIG. 6 schematically illustrates a configuration in which a plurality of touch lines and a plurality of touch electrodes are connected in the touch display device according to exemplary embodiments.

FIG. 6 schematically illustrates a configuration in which a plurality of touch lines and a plurality of touch electrodes are connected in the touch display device according to exemplary embodiments.

Referring to FIG. 6, a plurality of touch electrodes T1 and T2 are disposed on the touchscreen panel TSP of the touch display device according to exemplary embodiments. In addition, a touch sensing circuit TSC is provided to supply a touch driving signal to at least one of the plurality of touch electrodes TE1 and TE2 and to sense a touch and/or determine touch coordinates, based on signals detected by the touch electrodes TE1 and TE2 to which the touch driving signal is applied.

In addition, each of the plurality of touch electrodes TE1 and TE2 is electrically connected to the touch sensing circuit TSC via one or more touch lines, among the touch lines TL1 and TL2.

Specifically, the plurality of touch electrodes include the first touch electrodes TE1 and the second touch electrodes TE2. The first touch electrodes TE1 are connected to the first touch lines TL1, whereas the second touch electrodes TE2 are connected to the second touch lines TL2.

Portions or the entirety of the first touch lines TL1 and can overlap the second touch lines TL2. In other words, the first touch lines TL1 can be disposed above the second touch lines TL2. This can consequently reduce the area in which the first and second touch lines TL1 and TL2 are disposed.

For example, when n number of touch electrodes TE are present on the touchscreen panel 210, there can also be n number of touch lines connected to the touch electrodes TE. The n number of touch lines must be disposed so as not to affect the degree of opening of the OLED panel.

The greater the number of the touch electrodes TE is, the greater the number of the touch lines also is. However, increases in the number of the touch lines make it more difficult to dispose the touch lines so as not to overlap the emission areas of the OLED panel. Since the increased number of the touch electrodes TE lowers the degree of opening of the OLED panel, the ability to increase the number of the touch electrodes TE while guaranteeing the degree of opening of the OLED panel is required.

In the touch display device according to exemplary embodiments, the first and second touch lines TL1 and TL2, connected to different touch electrodes TE, are disposed to overlap each other, such that the area occupied by the first and second touch lines TL1 and TL2 can be reduced.

For example, a case in which a total number of the first and second touch lines TL1 and TL2 is m, where m can be an even number, and an area on the plane, occupied by the first and second touch lines TL1 and TL2, is equal to an area of the m number of touch lines, will be taken. According to exemplary embodiments, the first and second touch lines TL1 and TL2 are disposed to overlap each other, such that, when the total number of the first and second touch lines TL1 and TL2 is m, the area on the plane, occupied by the first and second touch lines TL1 and TL2, can be equal to an area of m/2 number of touch lines.

In addition, when m is an odd number, the area on the plane, occupied by the first and second touch lines TL1 and TL2, can be an area of (m/2+1) number of touch lines.

As described above, in the touch display device according to exemplary embodiments, the area occupied by the plurality of first and second touch lines TL1 and TL2 can be reduced. Accordingly, the touch display device according to exemplary embodiments can be effective for a large-sized touchscreen panel requiring a large number of touch electrodes or a touch display device requiring high touch sensitivity.

The first touch lines TL1 can be connected to the first touch electrodes TE1, by being connected to a first touch electrode TE1 located closest to the touch sensing circuit TSC first. The second touch lines TL2 can first be connected to the second touch electrodes TE2, by being connected to a second touch electrode TE2 located farthest from the touch sensing circuit TSC first.

Here, the overlapping first and second touch lines TL1 and TL2 can be connected to the first and second touch electrodes TE1 and TE2 located on a single touch electrode layer.

Accordingly, as illustrated in FIG. 6, the first touch line TL1 can be shorter than the second touch line TL2. In addition, the first touch electrode TE1, connected to the first touch line TL1, can be located to be closer to the touch sensing circuit than to the second touch electrode TE2, connected to the second touch line TL2, is.

Hereinafter, this configuration will be described in more detail with reference to FIGS. 7 to 9.

Figure 7:
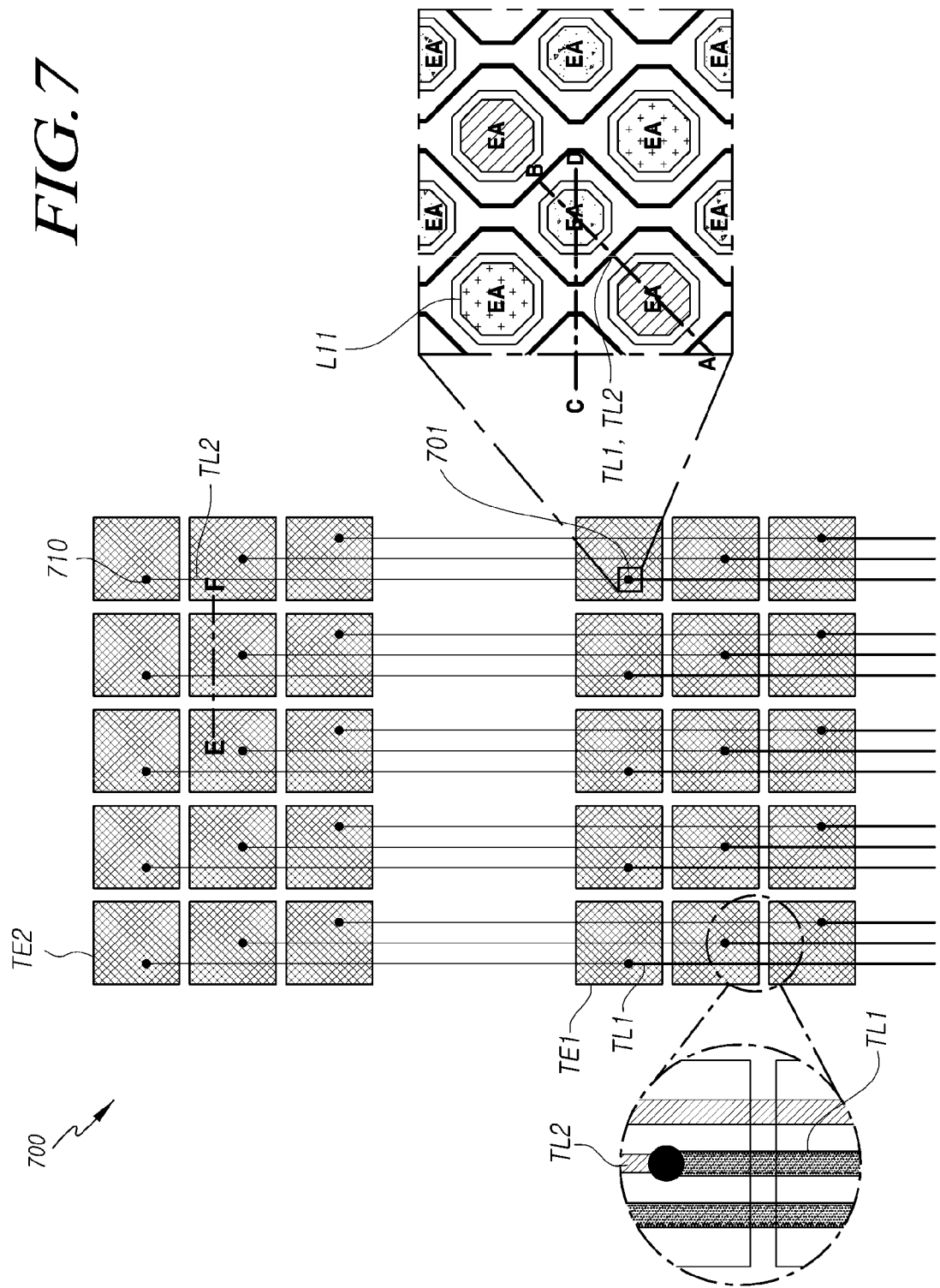
FIG. 7 is a plan view illustrating a touchscreen panel of a touch display device according to exemplary embodiments.

FIG. 7 is a plan view illustrating a touchscreen panel of a touch display device according to exemplary embodiments.

Referring to FIG. 7, the touch display device 700 according to exemplary embodiments is provided as a plurality of touch electrodes TE. The plurality of touch electrodes TE include a plurality of first touch electrodes TE1 and a plurality of second touch electrodes TE2. Each of the first touch electrodes TE1 and the second touch electrodes TE2 can be one of the plurality of touch electrodes TE illustrated in FIG. 2.

The plurality of touch electrodes TE can be categorized as the first touch electrodes TE1 or the second touch electrodes TE2, depending on the type of the touch lines connected thereto.

Specifically, the first touch electrodes TE1 are electrodes connected to the first touch lines TL1, whereas the second touch electrodes TE2 are electrodes connected to the second touch lines TL2.

That is, the plurality of first touch electrodes TE1 are connected to the plurality of first touch lines TL1, respectively, whereas the plurality of second touch electrodes TE2 are connected to the plurality of second touch lines TL2, respectively.

Here, the first touch lines TL1 can be connected to the first touch electrodes TE1 through first contact-holes 701 in an insulating layer disposed between the first touch electrodes TE1 and the first touch lines TL1, whereas the second touch lines TL2 can be connected to the second touch electrodes TE2 through second contact-holes 710 in an insulating layer disposed between the second touch electrodes TE2 and the second touch lines TL2.

The first contact-hole 701 means the entirety or a portion of a contact-hole connecting the first touch line TL1 and the first touch electrode TE1. The second contact-hole 710 means the entirety or a portion of a contact-hole connecting the second touch line TL2 and the second touch electrode TE2.

The first touch lines TL1 can be connected to the first touch electrode TE1, by being connected to the first touch electrode TE1 located closest to the touch sensing circuit TSC first. The second touch lines TL2 can be connected to the second touch electrodes TE2, by being connected to the second touch electrode TE2 located farthest from the touch sensing circuit TSC first.

Accordingly, the lengths of the first touch lines TL1 can be determined, depending on the positions of the first touch electrodes TE1 connected thereto, whereas the lengths of the second touch lines TL2 can be determined, depending on the positions of the second electrodes TE2 connected thereto.

Since the second touch electrodes TE2 are disposed farther from the touch sensing circuit TSC than from the first touch electrodes TE1, the lengths of the first touch lines TL1 can be shorter than the second touch lines TL2.

Both of the first touch lines TL1 can be disposed in areas in which touch electrodes TE (including first and second touch electrodes TE1 and TE2), disposed therein, are located farther from the touch sensing circuit TSC than from the first touch electrodes TE1, among the plurality of first touch electrodes TE1, connected to first touch lines TL1.

In the area in which the first touch lines TL1 are not disposed, only the second touch lines TL2 can be disposed. The touch electrodes TE, disposed in the area in which only the second touch lines TL2 are disposed, are connected to the second touch lines TL2.

This configuration can prevent resistance from increasing in the areas in which the first touch lines TL1 are not disposed.

As illustrated in FIG. 7, the first and second touch lines TL1 and TL2 can be disposed overlap each other, and can be shaped in a zigzag pattern. Since the first and second touch lines TL1 and TL2 overlap each other, a pair of the first and second touch lines TL1 and TL2 can appear to be a single line when viewed on a plane.

Accordingly, the first and second touch lines TL1 and TL2 can be disposed so as not to hide emission areas EA of the OLED panel, thereby improving the degree of opening of the OLED panel.

Specifically, the emission areas EA of the OLED panel can be defined by banks L11 disposed on the OLED panel. The remaining areas, other than the emission areas EA, can be non-emission areas.

The first and second touch lines TL1 and TL2 are disposed in areas corresponding to the non-emission areas of the OLED panel. In this regard, the first and second touch lines TL1 and TL2 can be shaped in a zigzag pattern. Specifically, the first and second touch lines TL1 and TL2 can be provided in the zigzag pattern so as not to overlap the emission areas EA of the OLED panel. However, the present disclosure is not limited thereto, and any configuration in which the first and second touch lines TL1 and TL2 are located between a subpixel including an emission area EA and an adjacent subpixel can be used.

Although the first and second touch lines TL1 and TL2 are illustrated, in FIG. 7, as being shaped in a zigzag pattern to be disposed in non-emission areas, exemplary embodiments are not limited thereto. Rather, any configuration that does not lower the degree of opening of the OLED panel while allowing the first and second touch lines TL1 and TL2 to be easily connected to the touch electrodes TE can be used.

The first and second touch lines TL1 and TL2 can be made of a transparent or opaque metal material. Since the first and second touch lines TL1 and TL2 are designed, as described above, so as not to overlap the emission areas EA of the OLED panel, the degree of opening of the OLED panel is not influenced by whether the first and second touch lines TL1 and TL2 are made of a transparent metal or an opaque metal.

In subsequence, hereinafter, the arrangement relationship between the components of the touch display device according to exemplary embodiments will be described with reference to FIGS. 8 to 10.

Figure 8:
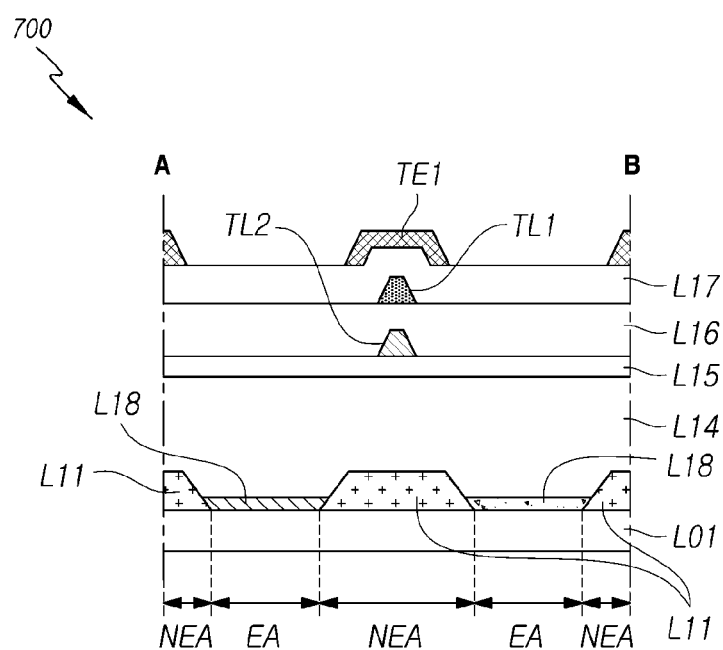
FIG. 8 is a cross-sectional view taken along line A-B in FIG. 7.

FIG. 8 is a cross-sectional view taken along line A-B in FIG. 7.

In FIG. 8, first and second touch lines TL1 and TL2, disposed between two emission areas EA disposed along line A-A, will be described. Referring to FIG. 8, the touch display device 700 according to exemplary embodiments includes a substrate L01, banks L11, an encapsulating layer L14, the first touch lines TL1, the second touch lines TL2, the first touch electrodes TE1, and the like.

Specifically, an organic layer L18, including the banks L11 and a light-emitting layer, is disposed on the substrate L01. A plurality of thin-film transistors and the like can be disposed below the banks L11 and the organic layer L18, and first electrodes of OLEDs can also be provided. Second electrodes of the OLEDs can be disposed above the banks L1L and the organic layer L180.

At least one layer of the encapsulating layer L14 is disposed on the banks L11 and the organic layer L18. A buffer layer L15 is disposed on the encapsulating layer L14.

A first insulating layer L16 is disposed on the second touch lines TL2, and the first touch lines TL1 are disposed on the first insulating layer L16. Here, the first touch lines TL1 are disposed to overlap the second touch lines TL2.

A second insulating layer L17 is disposed on the first touch lines TL1. A plurality of touch electrodes TE can be disposed on the second insulating layer L17, and the first touch electrodes TE1, among the plurality of touch electrodes TE, can be disposed to overlap the first and second touch lines TL1 and TL2.

Since a region, in which the first touch line TL1 and the first touch electrode TE1 are connected, is not included in the area illustrated in FIG. 8, a structure connecting the first touch line TL1 and the first touch electrode TE1 is not illustrated.

The region, in which the first touch line TL1 and the first touch electrode TE1 are connected, will be described with reference to FIG. 9.

Figure 9:
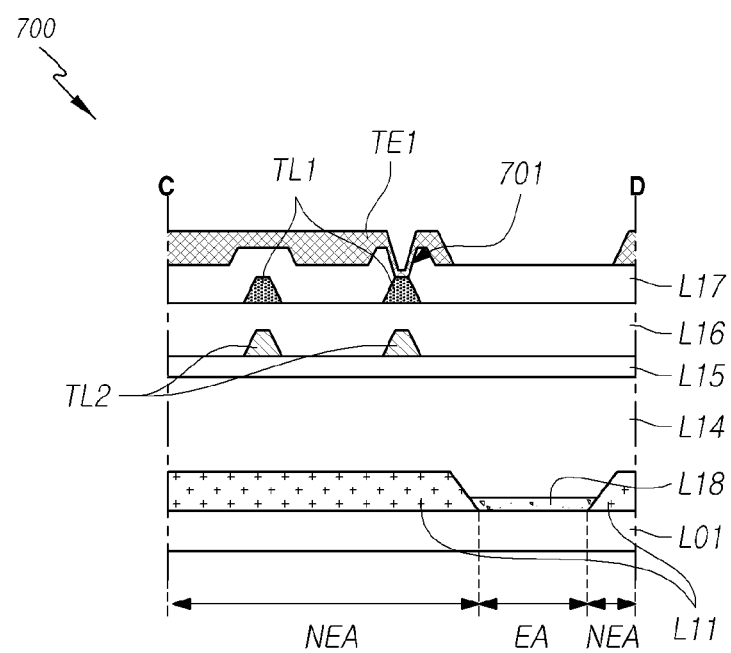
FIG. 9 is a cross-sectional view taken along line C-D in FIG. 7.

FIG. 9 is a cross-sectional view taken along line C-D in FIG. 7. In the following descriptions, features the same as those described above can be omitted.

Referring to FIG. 9, the first touch lines TL1 and the second touch lines TL2 are disposed to overlap each other, with the first insulating layer L16 being disposed therebetween.

Accordingly, touch lines connected to different electrodes can be disposed on dual layers. This structure can increase the number of the touch lines disposed on the touchscreen panel.

In addition, the touch electrode TE1 can be disposed on the first touch line TL1 in an overlapping manner.

In FIG. 9, the first touch line TL1 and the first touch electrode TE1 can be connected through a first contact-hole 701.

Specifically, the first contact-holes 710 can be provided in the second insulating layer L17, selectively in the regions in which the first touch lines TL1 and the first touch electrodes TE1 are connected. The first contact-holes 701 are absent in regions that do not correspond to the regions in which the first touch lines TL1 and the first touch electrodes TE1 are connected.

Figure 10:
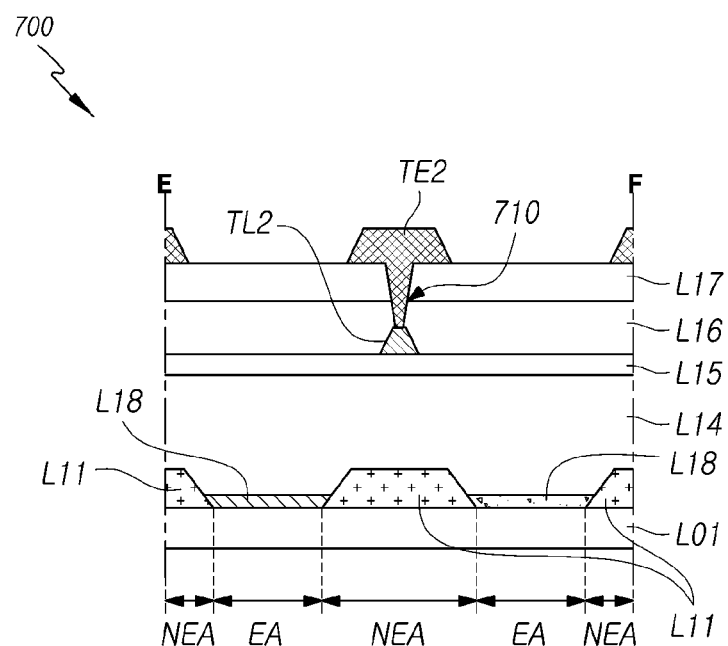
FIG. 10 is a cross-sectional view taken along line E-F in FIG. 7.

FIG. 10 is a cross-sectional view taken along line E-F in FIG. 7. In the following descriptions, features the same as those described above can be omitted.

Referring to FIG. 10, the second touch line TL2 is connected to the second touch electrode TE2 through a second contact-hole 710 provided in the first and second insulating layers L16 and L17.

In the region of the line E-F in FIG. 7, the first touch lines TL1 are not provided. That is, in regions in which the first touch lines TL1 are not provided, the second touch lines TL2 are connected to touch electrodes (e.g., the second touch electrodes TE2).

As illustrated in FIGS. 7 and 9, in the case of connections to the touch electrodes in regions in which the first and second touch lines TL1 and TL2 are disposed, the first touch lines TL1, located above the second touch lines TL2, are connected to touch electrodes (e.g., the first touch electrodes TE1).

That is, the touch display device 700 according to exemplary embodiments includes regions in which the first and second touch lines TL1 and TL2 overlap and regions in which the first and second touch lines TL1 and TL2 do not overlap.

In addition, in regions in which the first and second touch lines TL1 and TL2 overlap, the first touch lines TL1 can be located closer to the touch electrodes TE than to the second touch lines TL2. Thus, the touch electrodes TE can be connected to the first touch lines TL1, which are closer thereto.

In a case in which the first touch lines TL1 are connected to specific touch electrodes TE, the first touch lines TL1 cannot be disposed in regions in which the remaining touch electrodes TE are disposed farther from the touch sensing circuit TSC than the specific touch electrodes TE to which the touch sensing circuit TSC are connected. In these regions, the first touch lines TL1 cannot overlap the second touch lines TL2.

In addition, in the regions in which the first touch lines TL1 do not overlap the second touch lines TL2, the touch electrodes TE can be connected to the second touch lines TL2.

As described above, the first touch lines TL1, shorter than the second touch lines TL2, are located above the second touch lines TL2.

For example, in a case in which the first touch line TL1 is disposed below the second touch line TL2, connecting the first touch line TL1 to the first touch electrode TE1 resultantly causes the second touch line TL2, located above the first touch electrode TE1, to be connected to the first touch electrode TE1. Consequently, the second touch line TL2 is connected to both the first touch electrode TE1 and the second touch electrode TE2.

That is, a single touch line connected to two touch electrodes TE can reduce touch sensitivity.

According to exemplary embodiments, to overcome this problem, the second touch lines TL2 are connected to the second touch electrodes TE2 in the regions in which the first touch lines TL1 do not overlap the second touch lines TL2.

In this regard, the shorter first touch lines TL1 must be disposed above the second touch lines TL2 that the shorter first touch lines TL1 overlap.

In addition, as illustrated in FIGS. 7 to 10, the touch electrodes TE and the touch lines TL1 and TL2 can be disposed in a corresponding manner, in regions in which the banks L11 are disposed. In other words, the touch electrodes TE and the touch lines TL1 and TL2 can be disposed to overlap the banks L11.

The banks L11 are disposed in non-emission areas NEA of the OLED panel. The touch electrodes TE and the touch lines TL1 and TL2, overlapping the banks L11, can also be disposed in the non-emission areas NEA. Accordingly, the degree of opening of the OLED panel is not influenced, regardless of the material of either the touch electrodes TE or the touch lines TL1 and TL2.

In subsequence, hereinafter, a touch display device 700 according to other exemplary embodiments will be described with reference to FIG. 11.

Figure 11:
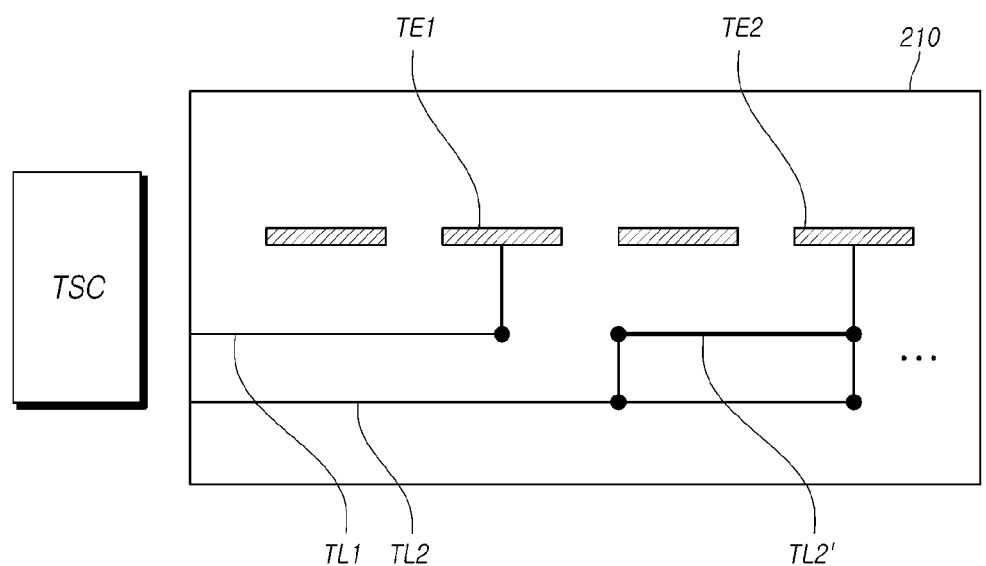
FIG. 11 schematically illustrates a configuration in which a plurality of touch lines and a plurality of touch electrodes are connected in the touch display device according to other exemplary embodiments.

FIG. 11 schematically illustrates a configuration in which a plurality of touch lines and a plurality of touch electrodes are connected in the touch display device according to other exemplary embodiments. In the following descriptions, features the same as those described above can be omitted.

Referring to FIG. 11, in the touch display device according to other exemplary embodiments, a plurality of touch electrodes TE1 and TE2, first touch lines TL1, second touch lines TL2, and additional touch lines TL2' are provided.

The plurality of touch electrodes include first touch electrodes TE1 and second touch electrodes TE2. The first touch electrodes TE1 are connected to the first touch lines TL1, and the second touch electrodes TE2 are connected to the additional touch lines TL2' and the second touch lines TL2.

Specifically, the additional touch lines TL2' can be disposed on the same layer as the first touch lines TL1, spaced apart from the first touch lines TL1 by predetermined distances. The first touch lines TL1 can be electrically separated from the additional touch lines TL2'.

In other words, the first touch lines TL1 can be terminated after being connected to the first touch electrodes TE1, and the additional touch lines TL2' can extend from points spaced apart from the first touch lines TL1 by predetermined distances.

In addition, the second touch lines TL2 can be disposed to overlap the first touch lines TL1 and the additional touch lines TL2'. Both ends of each additional touch line TL2' can be electrically connected to a corresponding second touch line TL2. This can consequently reduce the resistance of the second touch line TL2, which is longer.

The additional touch lines TL2' can be disposed in regions corresponding to regions in which the second touch lines TL2 are connected to the second touch electrodes TE2. As illustrated in FIG. 11, the second touch lines TL2 are connected to the second touch electrodes TE2 via the additional touch lines TL2', since the additional touch lines TL2' are located above the second touch lines TL2. Accordingly, the additional touch lines TL2' can also be connected to the second touch electrodes TE2.

Hereinafter, this configuration will be described in more detail with reference to FIGS. 12 to 15.

Figure 12:
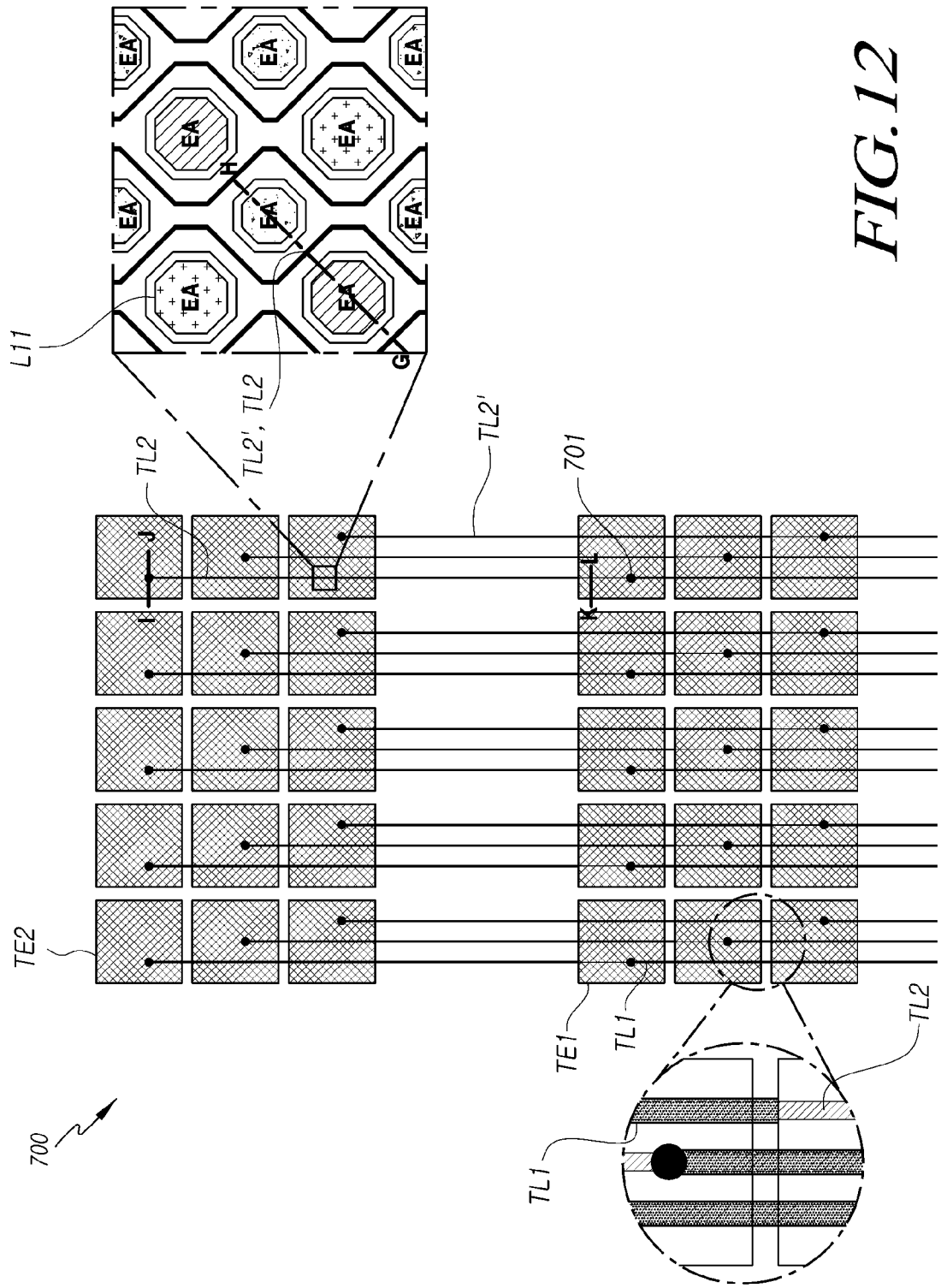
FIG. 12 is a plan view illustrating a touchscreen panel of the touch display device according to other exemplary embodiments.

FIG. 12 is a plan view illustrating a touchscreen panel of the touch display device according to other exemplary embodiments. In the following descriptions, features the same as those described above can be omitted.

Referring to FIG. 12, a plurality of touch electrodes TE are disposed on the touchscreen panel TSP of the touch display device 700 according to exemplary embodiments. The plurality of touch electrodes TE include a plurality of first touch electrodes TE1 and a plurality of second touch electrodes TE2.

In addition, a plurality of first touch lines TL1 connected to the first touch electrodes TE1 and a plurality of second touch lines TL2 connected to the second touch electrodes TE2 are provided.

Furthermore, additional touch lines TL2' are provided to be located on the same layer as and spaced apart from the first touch lines TL1.

In addition, the first touch lines TL1 and the additional touch lines TL2' are disposed to overlap the second touch lines TL2. The second touch lines TL2 can be disposed below the first touch lines TL1 and the additional touch lines TL2'.

The first touch lines TL1 can be connected to the first touch electrodes TE1 through first contact-holes 701. The first touch lines TL1 cannot further extend after being connected to the first touch electrodes TE1. The additional touch lines TL2' can be disposed to be spaced apart from the first touch lines TL1 by predetermined distances. In regions in which the additional touch lines TL2' are spaced apart from the first touch lines TL1, only the second touch lines TL2 can be disposed.

The additional touch lines TL2' can be connected to the second touch lines TL2 through third contact-holes provided in an insulating layer disposed between the second touch lines TL2 and the additional touch lines TL2'. Thus, the additional touch lines TL2' can be disposed to be in contact with the second touch lines TL2 in some regions (e.g., regions in which the third contact-holes are provided).

For example, the additional touch lines TL2' can be connected to the second touch lines TL2 through the third contact-holes in the entirety of regions in which the additional touch lines TL2' are disposed.

Since the second touch lines TL2 are longer than the first touch lines TL1, the resistance of the second touch lines TL2 can be greater than the resistance of the first touch lines TL1. However, as described above, the additional touch lines TL2' being connected to the second touch lines TL2 can increase the cross-sectional area, thereby reducing the resistance of the second touch lines TL2.

As illustrated in FIG. 12, the first and second touch lines TL1 and TL2 and the additional and second touch lines TL2' and TL2 can be disposed to overlap, and can be shaped in a zigzag pattern. Since the first and second touch lines TL1 and TL2 overlap the additional and second touch lines TL2' and TL2, the first and second touch lines TL1 and TL2 and the additional and second touch lines TL2' and TL2 can appear to be single lines when viewed on a plane.

Accordingly, the first and second touch lines TL1 and TL2 and the additional and second touch lines TL2' and TL2 can be disposed so as not to hide emission areas EA of the OLED panel, thereby improving the degree of opening of the OLED panel. In other words, the first and second touch lines TL1 and TL2, as well as the additional and second touch lines TL2' and TL2, can be shaped in a zigzag pattern so as not to overlap the emission areas EA of the OLED panel.

Here, the first touch lines TL1, the second touch lines TL2, and the additional touch lines TL2' can be made of a transparent or opaque metal material.

As described above, since the first touch lines TL1, the second touch lines TL2, and the additional touch lines TL2' are designed so as not to overlap the emission areas EA of the OLED panel, the degree of opening of the OLED panel is not influenced by whether the first touch lines TL1, the second touch lines TL2, or the additional touch lines TL2' are made of a transparent metal or an opaque metal.

Since other exemplary embodiments are provided as described above, the area of the touchscreen panel, occupied by the first and second touch lines TL1 and TL2, can be reduced. Even when the number of the first and second touch lines TL1 and TL2 is increased, the degree of opening can be prevented from being reduced. In addition, since the longer second touch lines TL2 are configured to be in contact with the additional touch lines TL2', the resistance of the second touch lines TL2 can be reduced.

In subsequence, hereinafter, the arrangement relationship between the components of the touch display device according to other exemplary embodiments will be described in more detail with reference to FIGS. 13 to 15.

Figure 13:
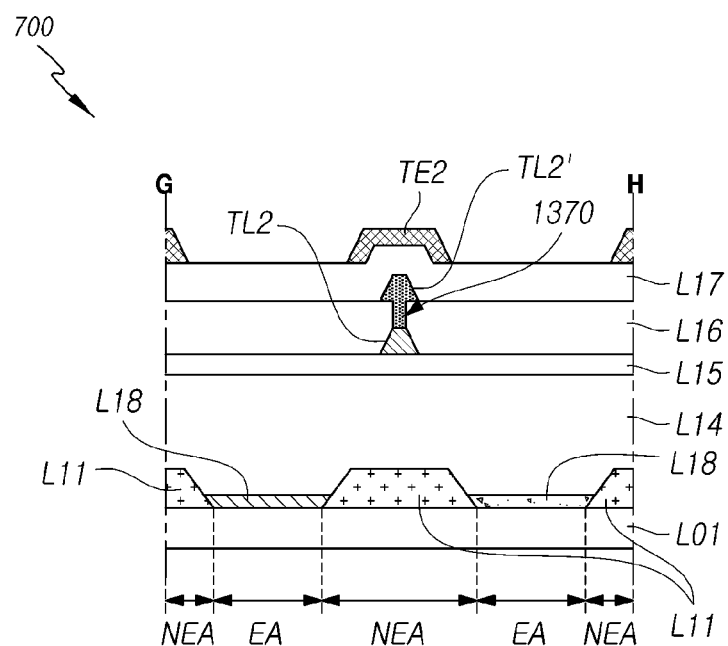
FIG. 13 is a cross-sectional view taken along line G-H in FIG. 12.

FIG. 13 is a cross-sectional view taken along line G-H in FIG. 12.

In FIG. 13, each second touch line TL2 and each additional touch line TL2', disposed between two emission areas EA provided along line G-H in FIG. 12, will be described. Referring to FIG. 13, the touch display device 700 according to other exemplary embodiments includes a substrate L01, banks L11, an encapsulating layer L14, the second touch lines TL2, the additional touch lines TL2', the second touch electrodes TE2, and the like.

An insulating layer L16 is disposed on the second touch lines TL2, and the additional touch lines TL2' are disposed on the first insulating layer L16. The additional touch lines TL2' are disposed to overlap the second touch lines TL2.

A second insulating layer L17 is disposed on the additional touch lines TL2'. The plurality of touch electrodes TE are disposed on the second insulating layer L17, and the second touch electrodes TE, among the plurality of touch electrodes TE, can be disposed to overlap the second touch lines TL2.

In addition, the second touch lines TL2 can be connected to the additional touch lines TL2' through third contact-holes 1370 provided in the first insulating layer L16. This can consequently reduce the resistance of the second touch lines TL2.

Since a region, in which the second touch line TL2 and the second touch electrode TE2 are connected, is not included in the area illustrated in FIG. 13, a structure connecting the second touch line TL2 and the second touch electrode TE2 is not illustrated.

The region, in which the second touch line TL2 and the second touch electrode TE2 are connected, will be described with reference to FIG. 14.

Figure 14:
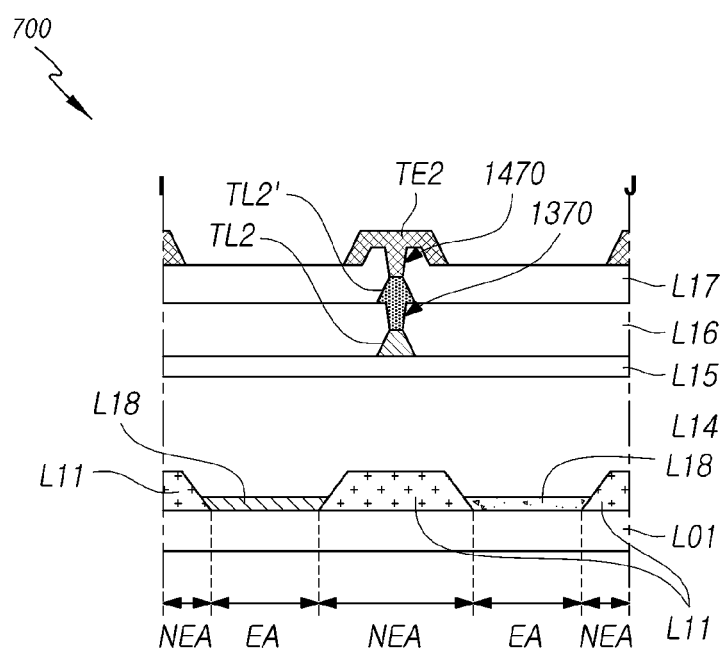
FIG. 14 is a cross-sectional view taken along line I-J in FIG. 12.

FIG. 14 is a cross-sectional view taken along line I-J in FIG. 12. In the following descriptions, features the same as those described above can be omitted.

Referring to FIG. 14, the second touch line TL2 and the additional touch line TL2' can be connected through the third contact-hole 1370 provided in the first insulating layer L16.

In addition, the second touch electrode TE2 is disposed on the additional touch line TL2'. The second touch electrode TE2 is connected to the additional touch line TL2' through a fourth contact-hole 1470 provided in the second insulating layer L17.

Since the additional touch line TL2' is also connected to the second touch line TL2, the second touch electrode TE2 is also connected to the second touch line TL2.

In the touch display device according to other exemplary embodiments, it has been described that only the second touch line TL2 can be disposed in the region corresponding to the region in which the first touch line TL1 is spaced apart from the additional touch line TL2' (see FIG. 12). This will be described in more detail with reference to the drawings.

Figure 15:
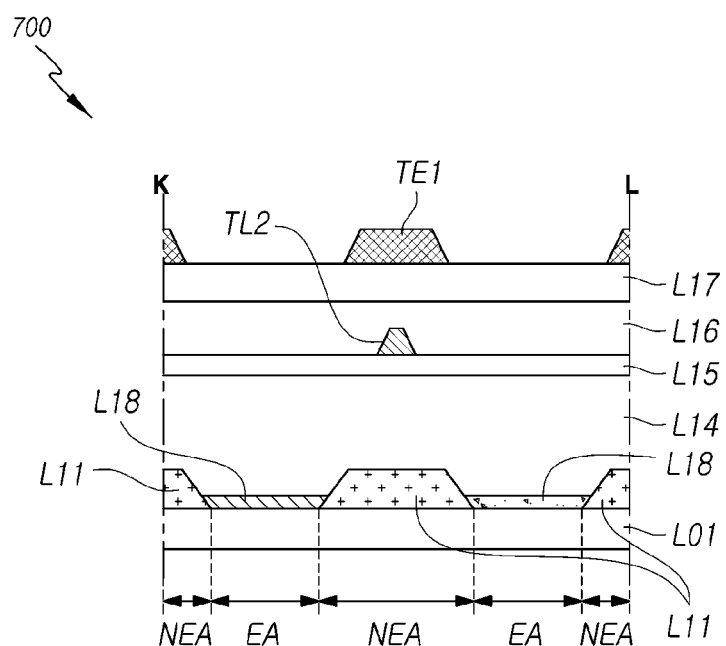
FIG. 15 is a cross-sectional view taken along line K-L in FIG. 12.

FIG. 15 is a cross-sectional view taken along line K-L in FIG. 12. In the following descriptions, features the same as those described above can be omitted.

Referring to FIG. 15, in regions corresponding to regions in which the first touch lines TL1 are spaced apart from the additional touch lines TL2', the second touch lines TL2 are disposed on a buffer layer L15. The first and second insulating layers L16 and L17 are disposed on the second touch lines TL2. In addition, the touch electrodes are disposed on the second insulating layer L17. Here, the touch electrodes can be the first touch electrodes TE1.

The above-described structure can be a structure in which the first touch line TL1 does not extend further after being connected to the first touch electrode TE1 and the additional touch line TL2' is disposed at a predetermined distance from the first touch line TL1, as illustrated in FIG. 12.

For example, in a case in which the first touch line TL1 is connected to the first touch electrode TE1 and the additional touch line TL2', the first touch line TL1 can not only be connected to the first touch electrode TE1, but also to the second touch electrode TE2 connected to the additional touch line TL2'.

According to other exemplary embodiments, as illustrated in FIGS. 12 to 15, since the first touch line TL1 is separated from the additional touch line TL2', the first touch line TL1 can only be connected to a single touch electrode TE, thereby improving touch sensitivity.

Hereinafter, a configuration in which first and second touch lines are connected to pads in a pad part of a touch display device according to exemplary embodiments will be described with reference to FIGS. 16 to 24.

Figure 16:
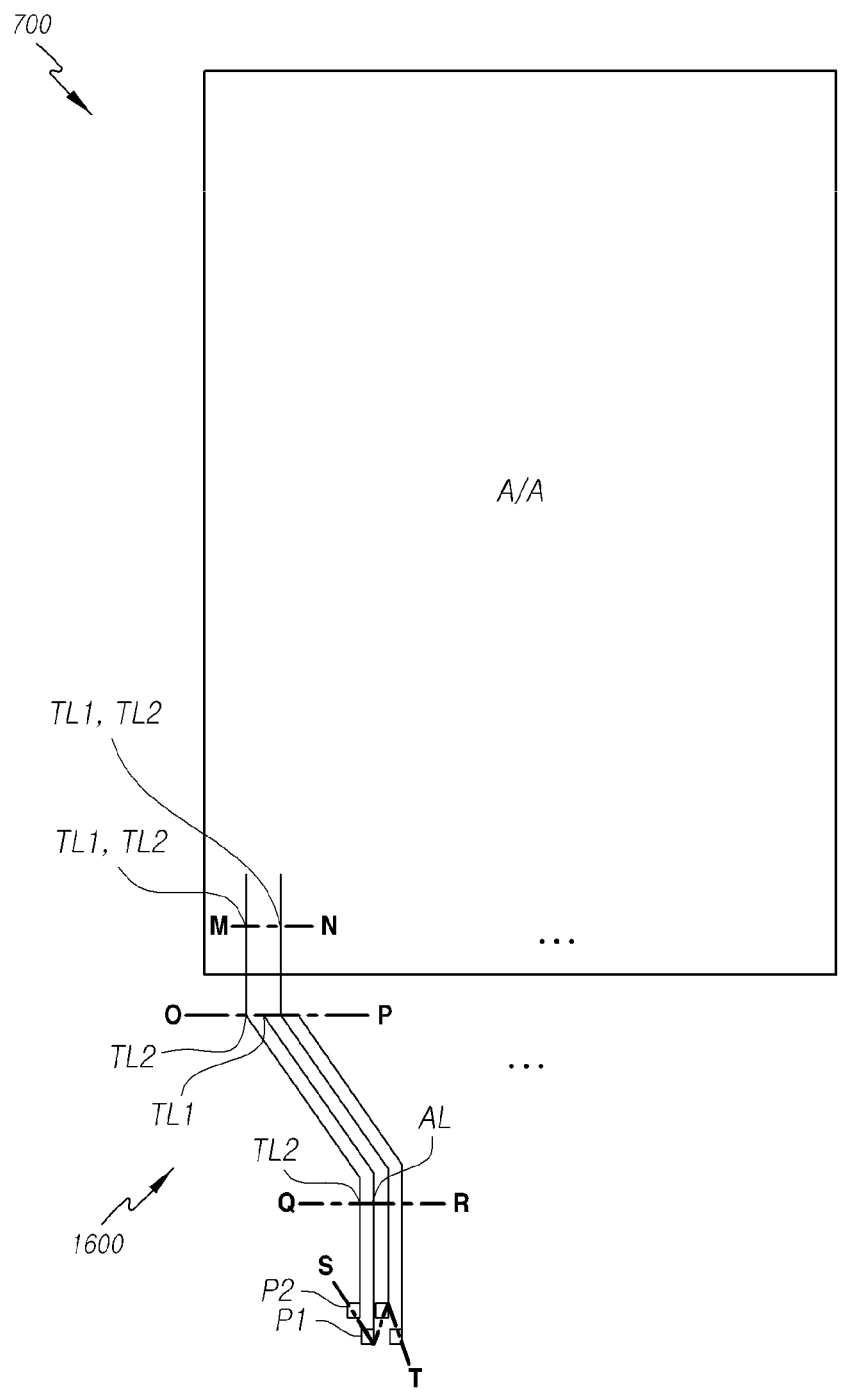
FIG. 16 is a plan view schematically illustrating the pad part of the touch display device according to exemplary embodiments.

FIG. 16 is a plan view schematically illustrating the pad part of the touch display device according to exemplary embodiments.

Referring to FIG. 16, the pad part 1600 of the touch display device according to exemplary embodiments is located outside of an active area AA. First touch lines TL1 and second touch lines TL2 are connected to first pads P1 and second pads P2. The first pads P1 and the second pads P2 can be touch pads.

Referring to FIG. 16, in the active area AA of the touch display device 700, a single first touch line TL1 and a corresponding single second touch line TL2 are disposed to overlap each other. The first touch lines TL1 and the second touch lines TL2, overlapping each other, extend from the active area AA to a portion of the pad part 1600 located outside of the active area AA.

The first touch lines TL1 and the second touch lines TL2 can be connected to the first pads P1 and the second pads P2 of the pad part 1600 to be electrically connected to a printed circuit connected to at least one side of the panel.

The lengths of the first touch lines TL1 can be shorter than the lengths of the second touch lines TL2, as described above. Thus, the distances between the first touch lines TL1 and the first pads P1 can be shorter than the distances between the second touch lines TL2 and the second pads P2.

Accordingly, signals can be supplied to the first touch electrodes connected to the first touch lines TL1, and signals can be supplied to the second touch electrodes connected to the second touch lines TL2.

In addition, the first pads P1 and the second pads P2 can be disposed on a single layer. In an area of the pad part 1600, the first touch lines TL1 and the second touch lines TL2 cannot overlap to be connected to the first pads P1 and the second pads P2. As illustrated in FIG. 16, the area in which the first and second touch lines TL1 and TL2 do not overlap can be adjacent to an area in which the first and second touch lines TL1 and TL2 overlap.

In other words, when the touch lines TL1 overlap the second touch lines TL2, it is difficult to connect the first and second touch lines TL1 and TL2 to the first and second pads P1 and P2 located on a single layer. Accordingly, the first touch lines TL1 do not overlap the second touch lines TL2 in the pad part 1600, so that the first touch lines TL1 and the second touch lines TL2 can be connected to the first pads P1 and the second pads P2.

In the area in which the first touch lines TL1 do not overlap the second touch lines TL2, the first touch lines TL1 can be connected to auxiliary lines AL disposed on the same layer as the second touch lines TL2. The auxiliary lines AL, connected to the first touch lines TL1, can be connected to the first pads P1.

Hereinafter, this configuration will be described in detail with reference to FIGS. 17 to 22. In the following descriptions, features the same as those described above can be omitted.

Figure 17:
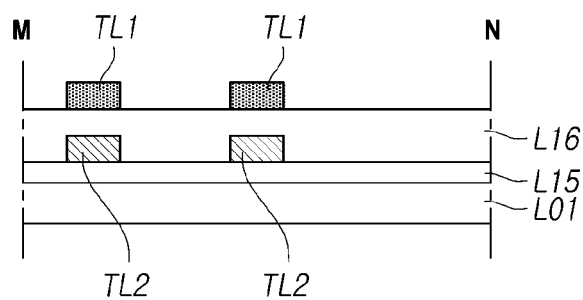
FIG. 17 is a cross-sectional view taken along line M-N in FIG. 16.
Figure 18:
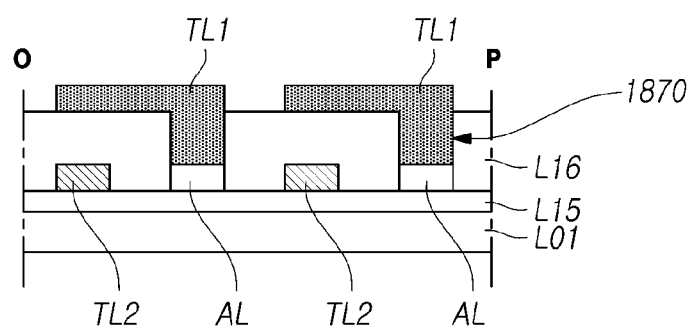
FIG. 18 is a cross-sectional view taken along line O-P in FIG. 16.
Figure 19:
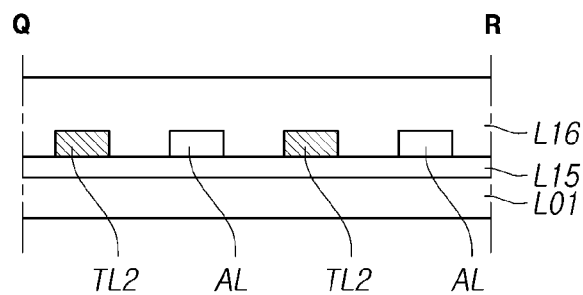
FIG. 19 is a cross-sectional view taken along line Q-R in FIG. 16.
Figure 20:
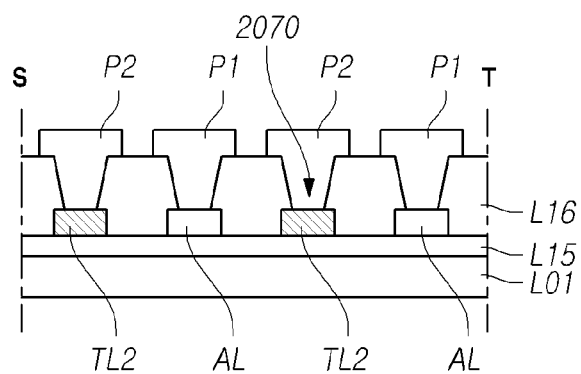
FIG. 20 is a cross-sectional view taken along line S-T in FIG. 16.

FIG. 17 is a cross-sectional view taken along line M-N in FIG. 16, FIG. 18 is a cross-sectional view taken along line O-P in FIG. 16, FIG. 19 is a cross-sectional view taken along line Q-R in FIG. 16, and FIG. 20 is a cross-sectional view taken along line S-T in FIG. 16.

FIG. 17 illustrates a portion of the active area AA, in which the first touch lines TL1 can overlap the second touch lines LT2. The first touch lines TL1 can be located above the second touch lines TL2.

FIG. 18 illustrates an area of the pad part, located outside of the display area AA, in which the first touch lines TL1 are connected to the auxiliary lines AL.

Referring to FIG. 18, the auxiliary lines AL are disposed on the same layer as the second touch lines TL2 to be spaced apart from the second touch lines TL2, and the first touch lines TL1 are connected to the auxiliary lines AL while overlapping the second touch lines TL2.

The first touch lines TL1 can be connected to the auxiliary lines AL through contact-holes 1870 provided in the first insulating layer L16 located on the first insulating layer L16.

As illustrated in FIG. 18, the first touch lines TL1 are connected to the auxiliary lines AL. As illustrated in FIG. 19, in an area closer to the first and second pads P1 and P2 (i.e., an area including the area taken along line O-P in FIG. 16) than to points at which the first touch lines TL1 are connected to the auxiliary lines AL, the second touch lines TL2 and the auxiliary lines AL are disposed on the buffer layer L15.

In addition, as illustrated in FIG. 19, in an area including the area taken along line Q-R in FIG. 16, the first touch lines TL1 do not overlap the second touch lines TL2. Specifically, in an area adjacent to the first and second pads P1 and P2 with respect to points at which the first touch lines TL1 are connected to the auxiliary lines AL, the first touch lines TL1 can be terminated.

That is, in the area adjacent to the first and second pads P1 and P2 with respect to the points at which the first touch lines TL1 are connected to the auxiliary lines AL, only the auxiliary lines AL, connected to the second touch lines TL2 and the first touch lines TL1, can be present.

In addition, as illustrated in FIG. 20, the auxiliary lines AL are connected to the first pads P1, and the second touch lines TL2 are connected to the second pads P2. The first and second pads P1 and P2 are located on the first insulating layer L16.

The first pads P1 can be connected to the auxiliary lines AL through contact-holes 2070 provided in the first insulating layer L16, whereas the second pads P2 can be connected to the second touch lines TL2 through contact-holes 2070 provided in the first insulating layer L16.

Since the auxiliary lines AL are connected to the first touch lines TL1 in the area taken along line O-P as described above, the first touch lines TL1 are consequently connected to the first pads P1.

In brief, the first touch lines TL1 or the second touch lines TL2 can be connected to the pads corresponding thereto, through the patterned connectors (e.g., the auxiliary lines AL) or the contact-holes in a different layer.

Even in the case in which the first touch lines TL1 overlap the second touch lines TL2 in the active area AA, the first touch lines TL1 and the second touch lines TL2 have the above-described arrangement relationship in the pad part. Accordingly, the first touch lines TL1 and the second touch lines TL2 can be connected to the first pads P1 and the second pads P2, respectively, disposed on the same layer.

Figure 21:
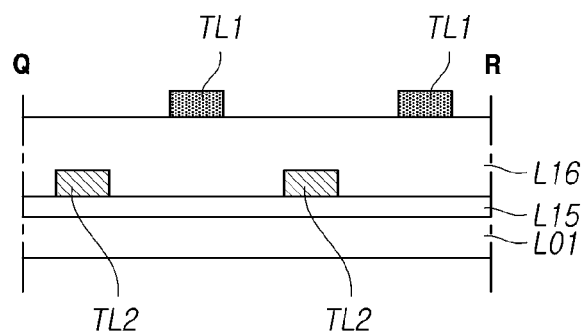
FIG. 21 is a cross-sectional view taken along line Q-R in FIG. 16, according to another exemplary embodiment.
Figure 22:
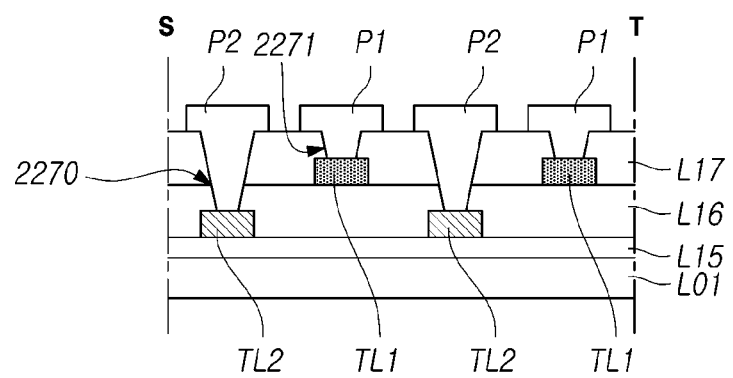
FIG. 22 is a cross-sectional view taken along line S-T in FIG. 16, according to another exemplary embodiment.

However, the present disclosure is not limited thereto, and the areas taken along line Q-R and the line S-R in FIG. 16 can have structures illustrated in FIGS. 21 and 22.

FIG. 21 is a cross-sectional view taken along line Q-R in FIG. 16, according to another exemplary embodiment, and FIG. 22 is a cross-sectional view taken along line S-T in FIG. 16, according to another exemplary embodiment. In the following descriptions, features the same as those described above can be omitted.

Referring to FIG. 21, the first touch lines TL1 and the second touch lines TL2 can be disposed so as not to overlap each other. The first touch lines TL1 can be located above the second touch lines TL2.

The first touch lines TL1 and the second touch lines TL2 can extend, without overlapping each other, so as to be connected to the first pads P1 and the second pads P2.

Specifically, as illustrated in FIG. 22, the second touch lines TL2 can be connected to the second pads P2 through contact-holes 2270 provided in the first and second insulating layers L16 and L17. The first touch lines TL1 can be connected to the first pads P1 provided on the insulating layer L17.

Even in the case in which the first touch lines TL1 overlap the second touch lines TL2 in the active area AA, the first and second touch lines TL1 and TL2 have the above-described arrangement in the pad part, such that the first and second touch lines TL1 and TL2 can be connected to the first pads P1 and the second pads P2 disposed on the same layer.

Figure 23:
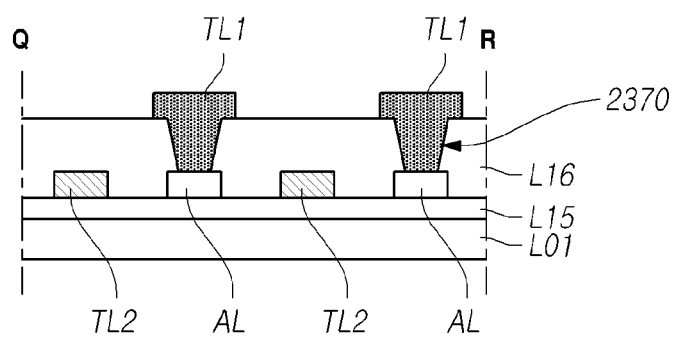
FIG. 23 is a cross-sectional view taken along line Q-R in FIG. 16, according to a further exemplary embodiment.
Figure 24:
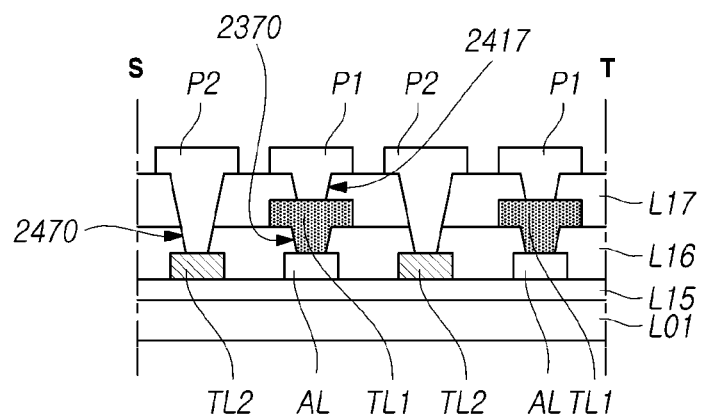
FIG. 24 is a cross-sectional view taken along line S-T in FIG. 16, according to a further exemplary embodiment

In addition, the areas taken along line Q-R and the line S-R in FIG. 16 can have structures illustrated in FIGS. 23 and 24.

FIG. 23 is a cross-sectional view taken along line Q-R in FIG. 16, according to a further exemplary embodiment, and FIG. 24 is a cross-sectional view taken along line S-T in FIG. 16, according to a further exemplary embodiment. In the following descriptions, features the same as those described above can be omitted.

Referring to FIG. 23, in the area taken along line Q-R in FIG. 16, the first touch lines TL1 can be connected to the auxiliary lines AL through contact-holes 2370 provided in the first insulating layer L16.

Specifically, the first touch lines TL1 can be connected to the auxiliary lines AL from points (i.e., the area taken along line O-P in FIG. 16) in which the first touch lines TL1 are connected to the auxiliary lines AL, before the first touch lines TL1 are connected to the first pads P1.

Since the first touch lines TL1 and the auxiliary lines AL are connected to each other as described above, the resistance of the first touch lines TL1 can be reduced.

In addition, as illustrated in FIG. 24, the second touch lines TL2, located on the buffer layer L15, can be connected to the second pads P2, located on the second insulating layer L17, through contact-holes 2470 provided in the first and second insulating layers L16 and L17. In addition, the auxiliary lines AL, located on the buffer layer L15, can be connected to the first touch lines TL1 through the contact-holes 2370 provided in the first insulating layer L16, and the first touch lines TL1 can be connected to the first pads P1 through contact-holes 2471 provided in the second insulating layer L17.

As described above, the first touch lines TL1 or the second touch lines TL2 can be connected to the corresponding pads through the patterned connectors or the contact-holes in a different layer.

Figure 25:
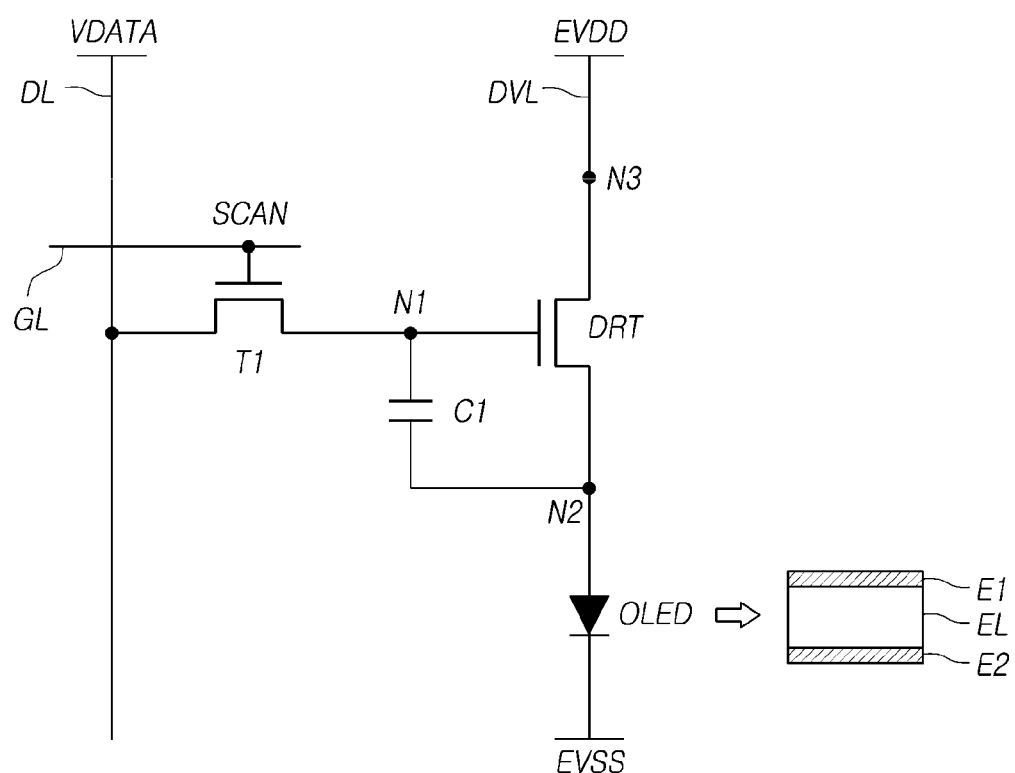
FIG. 25 is a circuit diagram illustrating an exemplary subpixel structure in the touch display device according to exemplary embodiments.
Figure 26:
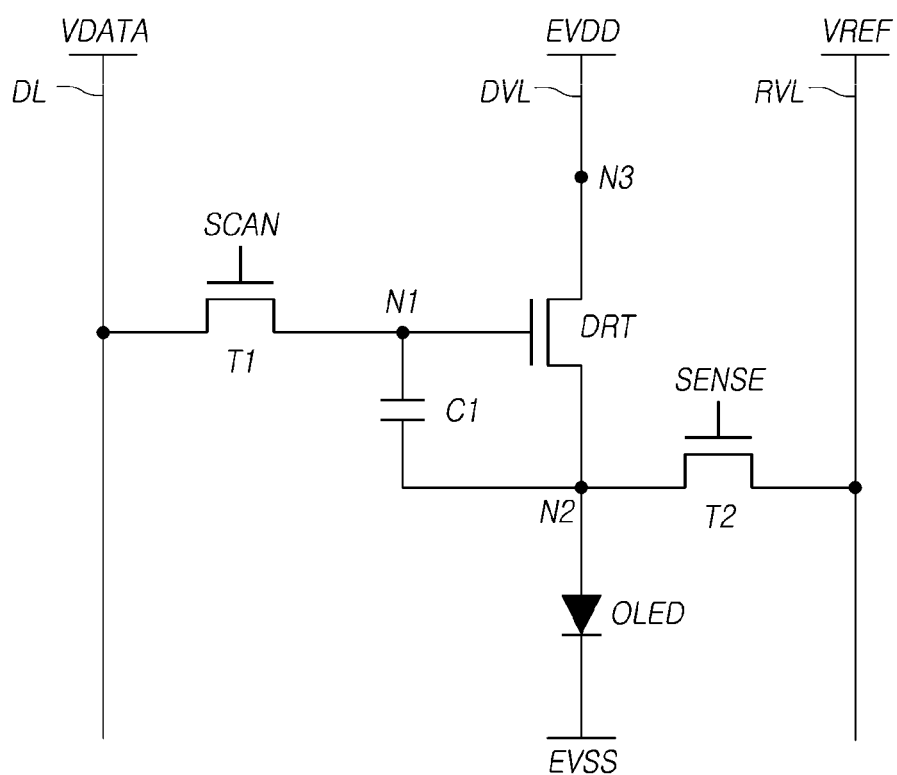
FIG. 26 is a circuit diagram illustrating another exemplary subpixel structure in the touch display device according to exemplary embodiments.

FIG. 25 is a circuit diagram illustrating an exemplary subpixel structure in the touch display device according to exemplary embodiments, and FIG. 26 is a circuit diagram illustrating another exemplary subpixel structure in the touch display device according to exemplary embodiments.

Referring to FIG. 25, when the touch display device 700 according to exemplary embodiments is an OLED, each of the subpixels essentially includes an OLED, a driving transistor DRT driving the OLED, a first transistor T1 transferring a data voltage to a first node N1 corresponding to a gate node of the driving transistor DRT, and a storage capacitor Cst maintaining a data voltage corresponding to an image signal voltage, or a voltage corresponding thereto, for a period of a single frame.

The OLED can include a first electrode E1 (e.g., an anode or a cathode), an organic light-emitting layer EL, a second electrode E2 (e.g., a cathode or an anode), and the like.

A base voltage EVSS can be applied to the second electrode E2 of the OLED.

The driving transistor DRT drives the OLED by supplying driving current to the OLED.

The driving transistor DRT has the first node N1, a second node N2, and a third node N3.

The first node N1 of the driving transistor DRT can be a node corresponding to a gate node, and can be electrically connected to a source node or a drain node of the first transistor T1.

The second node N2 of the driving transistor DRT can be electrically connected to the first electrode E1 of the OLED, and can be a source node or a drain node.

The third node N3 of the driving transistor DRT can be a node to which the driving voltage EVDD is applied, can be electrically connected to a driving voltage line DVL through which a driving voltage is supplied, and can be a drain node or a source node.

The first transistor T1 can be electrically connected between a data line DL and the first node N1 of the driving transistor DRT, and can be controlled by a scanning signal SCAN applied to the gate node through a gate line.

The first transistor T1 can be turned on by the scanning signal SCAN to transfer a data voltage Vdata, supplied from the data line DL, to the first node N1 of the driving transistor DRT.

The storage capacitor Cst can be electrically connected between the first node N1 and the second node N2 of the driving transistor DRT.

The storage capacitor Cst is an external capacitor intentionally designed to be provided outside of the driving transistor DRT, instead of being a parasitic capacitor (e.g., Cgs or Cgd), i.e., an internal capacitor, present between the first node N1 and the second node N2.

To control the voltage of the second node N2 of the driving transistor DRT or sense characteristic values of the subpixels (e.g., a threshold voltage or mobility of the driving transistor DRT or a threshold voltage of the OLED), each of the subpixels can further include a second transistor T2.

The second transistor T2 can be electrically connected to the second node N2 of the driving transistor DRT and a reference voltage line RVL through which a reference voltage Vref is supplied, and can be controlled by a sensing signal SENSE, i.e., a type of scanning signal, applied to the gate node.

The second transistor T2 is turned on by the sensing signal SENSE to apply the reference voltage Vref, supplied through the reference voltage line RVL, to the second node N2 of the driving transistor DRT.

The second transistor T2 can also be used as one of voltage sensing paths, which the driving transistor DRT uses to sense a voltage of the second node N2.

The scanning signal SCAN and the sensing signal SENSE can be separate gate signals. In this case, the scanning signal SCAN and the sensing signal SENSE can be applied to the gate node of the first transistor T1 and the gate node of the second transistor T2, respectively, through different gate lines.

In some cases, the scanning signal SCAN and the sensing signal SENSE can be the same gate signals. In this case, the scanning signal SCAN and the sensing signal SENSE can be applied commonly to the gate node of the first transistor T1 and the gate node of the second transistor T2 through the same gate lines.

Each of the driving transistor DRT, the first transistor T1, and the second transistor T2 can be an n-type transistor or a p-type transistor.

The subpixel structure is not limited to the structures illustrated in FIGS. 25 and 26, and a variety of modifications can be provided.

Figure 27:
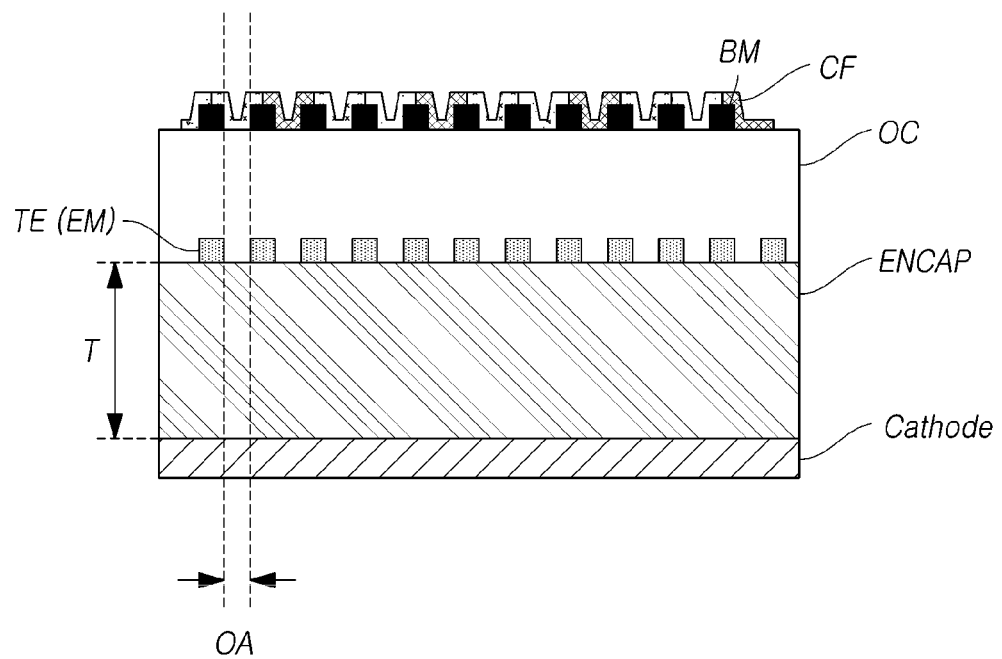
FIGS. 27 to 29 are cross-sectional views illustrating touch display devices according to exemplary embodiments.
Figure 28:
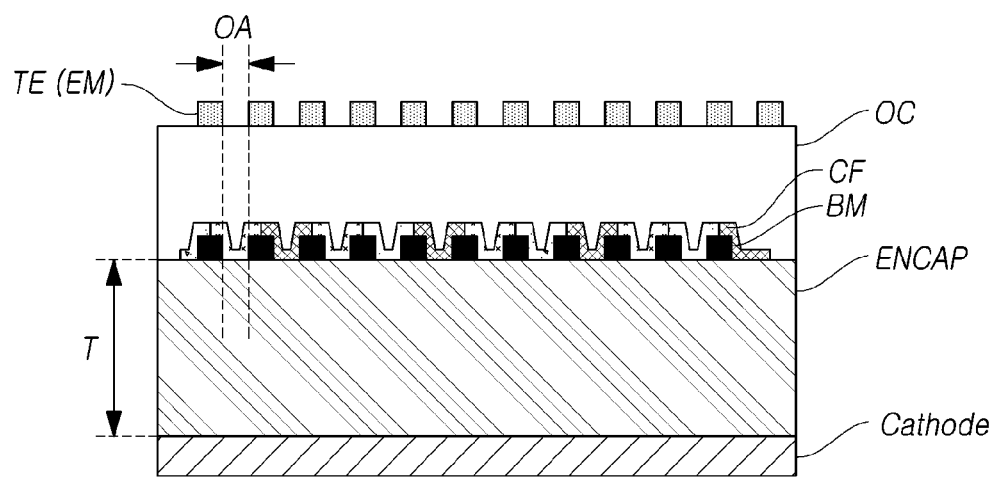
Figure 29:
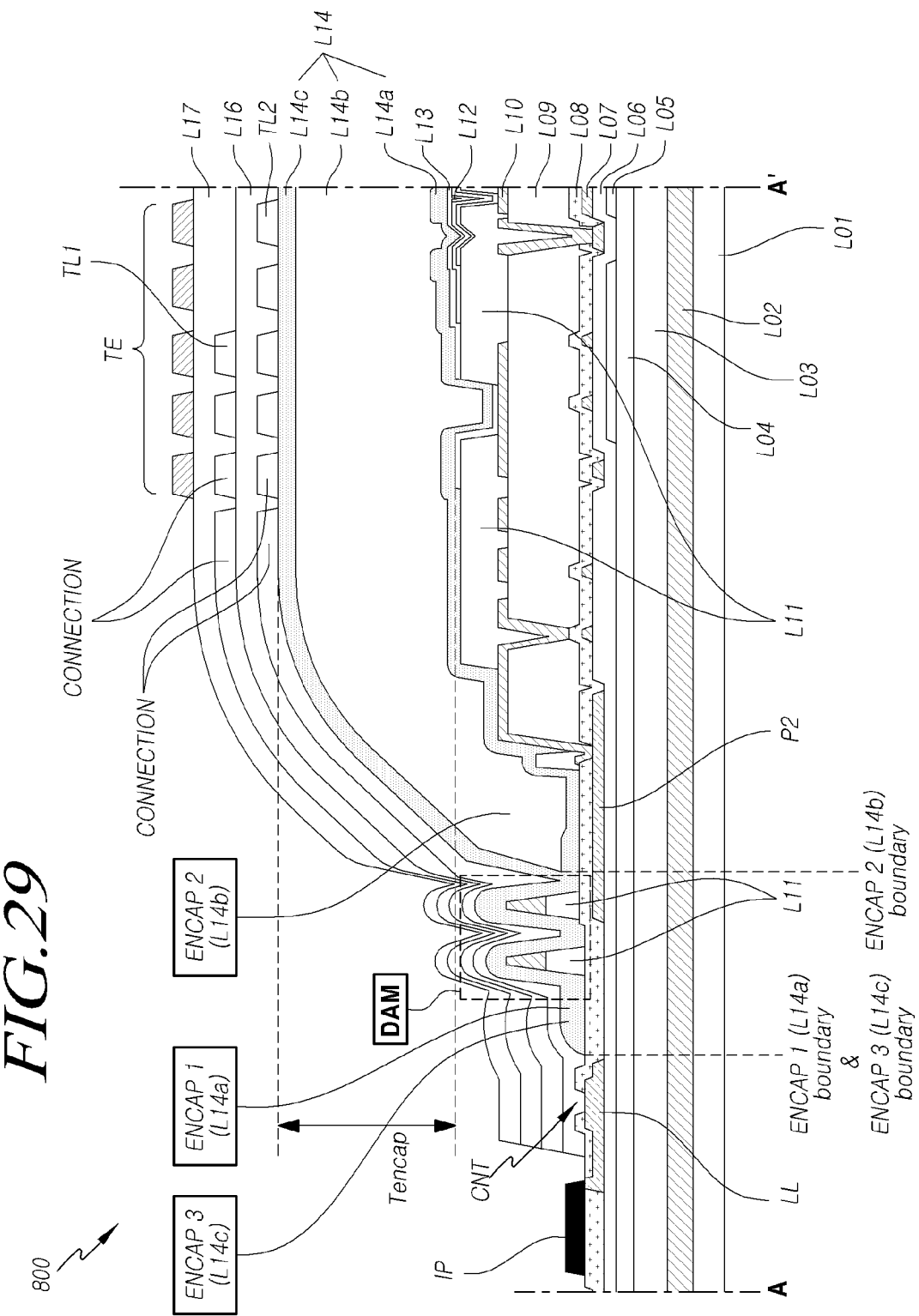

FIGS. 27 to 29 are cross-sectional views illustrating touch display devices according to exemplary embodiments.

Referring to FIGS. 27 and 28, in the case in which a touchscreen panel TSP is disposed within a display panel DISP, which is implemented as an organic light-emitting diode (OLED) display panel, the touchscreen panel TSP can be located on an encapsulating layer ENCAP in the display panel DISP. In other words, touch sensor metals, such as a plurality of touch electrodes TE and a plurality of touch lines TL, can be located on the encapsulating layer ENCAP in the display panel DISP.

Since the touch electrodes TE are provided on the encapsulating layer ENCAP as described above, the touch electrodes TE can be provided without influencing either the performance of display or the formation of a layer for display.

Referring to FIGS. 27 and 28, cathodes, which can act as second electrodes E2 of the OLEDs, can be provided below the encapsulating layer ENCAP.

The thickness T of the encapsulating layer ENCAP can be, for example, 5 µm or more.

Since the thickness of the encapsulating layer ENCAP is designed to be 5 µm or more as described above, parasitic capacitance created between the cathodes of the OLEDs and the touch electrodes TE can be reduced. This can consequently prevent touch sensitivity from being reduced by parasitic capacitance.

As described above, the plurality of touch electrodes TE are patterned such that each of the electrode metals EM is in the shape of a mesh having a plurality of open areas OA. One or more subpixels or emission areas thereof can be present in each of the plurality of open areas OA, when viewed in a vertical direction.

Since the electrode metal EM of the touch electrode TE is patterned such that one or more emission areas of subpixels are present in a position corresponding to each of open areas OA present in the area of the touch electrode TE, when viewed on a plane, as described above, the luminous efficiency of the display panel DISP can be improved.

Accordingly, as illustrated in FIGS. 27 and 28, the positions of a black matrix BM can correspond to the positions of the electrode metals EM of the touch electrodes TE.

In addition, a plurality of color filters CF can be provided in positions corresponding to the positions of the plurality of touch electrodes TE.

Since the plurality of color filters CF are located in positions corresponding to the positions of the plurality of open areas OA, as described above, an OLED display panel and a touch display device having excellent luminous performance can be provided (more particularly, using white OLEDs).

The vertical positional relationship between the plurality of color filters CR and the plurality of touch electrodes TE will be described as follows.

As illustrated in FIG. 27, the plurality of color filters CR and the black matrix BM can be located above the plurality of touch electrodes TE.

The plurality of color filters CR and the black matrix BM can be located on an overcoat layer OC on the plurality of touch electrodes TE.

As illustrated in FIG. 27, the plurality of color filters CR and the black matrix BM can be located below the plurality of touch electrodes TE.

The plurality of touch electrodes TE can be located on the overcoat layer OC on the plurality of color filters CR and the black matrix BM.

As described above, a touch display device having optimal positional relationship between the color filters CF and the touch electrodes TE can be provided by considering display performance, such as emission performance, and touch performance.

To improve the convenience of fabrication of the touch display device and reduce the size of the touch display device, in the related art, attempts for disposing the touchscreen panel TSP including the touch electrodes TE within the display panel DISP have been undertaken.

However, there are significant difficulties and a number of restrictions in disposing the touchscreen panel TSP within the display panel DISP, i.e., an OLED panel.

For example, in a fabrication process for the display panel DISP, i.e., an OLED panel, the organic material of the display panel causes difficulties in high-temperature processing for fabricating the touch electrodes TE, typically made of a metal material, within the panel.

Due to such constraints, such as the structural characteristics of the OLED display panel and the related process, it has been difficult to dispose the touch electrodes TE, acting as the touch sensors, within the OLED display panel DISP. Therefore, in the related art, a touch structure has been provided by attaching the touchscreen panel TSP to the OLED display panel DISP, rather than disposing the touchscreen panel TSP within the OLED display panel DISP.

However, the structure including the touch electrodes TE provided on the encapsulating layer ENCAP, as illustrated in FIGS. 27 and 28, makes it possible to provide the OLED display panel DISP, including the touchscreen panel TSP therein, having superior display performance and touch sensing performance.

Referring to FIG. 29, a polyimide (PI) layer L02 is provided on a substrate or a back plate L01.

A buffer layer L03 can be provided on the polyimide layer L02, and an interlayer insulating film L04 can be provided on the buffer layer L03.

A gate layer L05 can be present on the interlayer insulating film L04, and gate electrodes or the like can be provided in required positions of the gate layer L05.

A gate insulating film L06 can be present on the gate layer L05.

A source/drain layer L07 can be present on the gate insulating film L06.

Signal lines, such as data lines DL and link lines LL for connections to metals, source/drain electrodes of a variety of transistors, and the like can be provided on the source/drain layer L07.

A protective layer L08 can be present on the source/drain layer L07.

A planarization layer L09 can be provided on the protective layer L08, and a first electrode layer L10 can be present on the planarization layer L09. The first electrode layer L10 includes first electrodes E1 provided in positions corresponding to emission areas of subpixels, respectively.

A bank layer L11 is provided on the first electrode layer L10, and an organic light-emitting layer L18 is provided on the bank layer L11.

A second electrode layer L13 can be present on the organic light-emitting layer L18, commonly provided in the entirety of subpixel areas.

An encapsulating layer L14 for preventing penetration of moisture, air, and the like can be present on the second electrode layer L13.

A dam DAM can be present on the periphery of the panel.

The encapsulating layer L14 can be provided as a monolayer or a multilayer comprised of two or more layers stacked on each other. In addition, the encapsulating layer L14 can be a metal layer or a multilayer comprised of two or more layers, including at least one organic layer and at least one inorganic layer, stacked on each other.

In the case of an embodiment illustrated in FIG. 29, the encapsulating layer L14 is comprised of a first encapsulating layer ENCAP 1 (L14a), a second encapsulating layer ENCAP 2 (L14b), and a third encapsulating layer ENCAP 3 (L14c).

Each of the first encapsulating layer ENCAP 1 (L14a), the second encapsulating layer ENCAP 2 (L14b), and the third encapsulating layer ENCAP 2 (L14b) can be comprised of an organic layer and an inorganic layer.

Touch electrodes TE are provided on the encapsulating layer L14.

The touch electrodes TE can be, for example, mesh-type touch electrodes, each of which has open areas OA. The touch electrodes TE can be transparent electrodes.

In addition, touch lines TL can be provided on the encapsulating layer L14.

The touch lines TL and the touch electrodes TE can be provided on the same layer or different layers.

The touch lines TL, connected to the touch electrodes TE, extend to areas outside of the dam, i.e., areas adjacent to an integrated pad (IP), beyond the areas in which the touch electrodes TE and the dam DAM are provided.

In addition, in the areas outside of the dam, the touch lines TL can be connected to the link lines LL, provided in the source/drain layer L07, via contact-holes CNT.

The link lines LL can be electrically connected to the pad IP, present outside of the dam, to be connected to the touch driving circuit TDC.

The encapsulating layer L14 can be provided to a predetermined thickness Tencap. The thickness Tencap of the encapsulating layer L14 can be designed in consideration of an RC delay in touch driving and touch sensing, as well as the effect of the thickness on touch performance (touch sensitivity).

The dam DAM can be provided at or adjacently to one or more boundaries of the first, second, and third encapsulating layers L14a, L14b, and L14c.

The dam DAN can be provided at a predetermined thickness by stacking the banks L11, the encapsulating layer L14, and the like.

The dam DAM can prevent the encapsulating layers L14a, L14b, and L14c from collapsing in the outward direction of the panel.

Since the dam DAM includes extension portions of the encapsulating layers L14a, L14b, and L14c, the dam DAM can perform an encapsulating function, thereby protecting pixels or the like from moisture or the like that would otherwise penetrate into the panel through the sides.

Referring to FIG. 20, the plurality of first and second touch lines TL1 and TL2 are disposed on the display panel DISP to be electrically connected to the touch electrodes TE. In the peripheral areas of the display panel DISP (i.e., the areas outside of the dam), the encapsulating layer L14 cannot be disposed below the plurality of touch lines TL.

The electrode metals EM, corresponding to the plurality of touch electrodes TE, can overlap the plurality of banks L11 defining the subpixel areas.

According to exemplary embodiments as set forth above, a touchscreen panel in which a plurality of touch lines, connected to a plurality of touch electrodes, are disposed so as not to reduce the degree of opening of the touchscreen panel, and a touch display device including the same, can be provided.

According to other exemplary embodiments as set forth above, a touchscreen panel having a structure able to improve touch sensitivity, and a touch display device including the same, can be provided.

According to other exemplary embodiments as set forth above, a touchscreen panel having a structure able to reduce the resistance of touch lines, and a touch display device including the same, can be provided.

The foregoing descriptions and the accompanying drawings have been presented in order to explain the certain principles of the present disclosure. A person skilled in the art to which the present disclosure relates could make various modifications and variations by combining, dividing, substituting for, or changing the elements without departing from the principle of the present disclosure. The foregoing embodiments disclosed herein shall be interpreted as being illustrative, while not being limitative, of the principle and scope of the present disclosure. It should be understood that the scope of the present disclosure shall be defined by the appended Claims and all of their equivalents fall within the scope of the present disclosure.

What is claimed is:

1. A touch display device comprising:
a panel on which a plurality of touch electrodes are disposed; and
a touch sensing circuit configured to supply a touch driving signal to at least one touch electrode among the plurality of touch electrodes, and sense at least one of a touch and a touched position based on a signal detected using the touch electrode to which the touch driving signal is applied,
wherein the plurality of touch electrodes are respectively connected to the touch sensing circuit through at least one touch line,
the plurality of touch electrodes comprise first touch electrodes and second touch electrodes,
a portion or entirety of each of first touch lines connected to the first touch electrodes overlaps a corresponding one of second touch lines connected to the second touch electrodes,
wherein the first touch lines and the second touch lines are located on different layers, with an insulating layer being disposed between the first touch lines and the second touch lines,
wherein additional touch lines are located on a same layer as the first touch lines to be spaced apart from the first touch lines, and
wherein the additional touch lines are connected to the second touch electrodes.

2. The touch display device according to claim 1, wherein the first touch electrodes are located closer to the touch sensing circuit than the second touch electrodes.

3. The touch display device according to claim 1, wherein the first touch lines are shorter than the second touch lines.

4. The touch display device according to claim 1, wherein the first touch electrodes and the second touch electrodes are located on a same touch electrode layer.

5. The touch display device according to claim 4, wherein the first touch lines are located closer to the first touch electrodes than the second touch electrodes.

6. The touch display device according to claim 4, wherein the additional touch lines overlap the second touch lines.

7. The touch display device according to claim 1, wherein the panel comprises banks defining an emission area and a non-emission area, and
the plurality of touch electrodes, including the first touch electrodes and the second touch electrodes, are disposed in areas corresponding to the banks.

8. The touch display device according to claim 1, wherein the panel comprises an active area and a pad part disposed outside of the active area,
a specific area of the pad part comprises an area in which the first touch lines overlap the second touch lines, and
a remaining area of the pad part, located closer to pads than the specific area of the part, comprises an area in which the first touch lines do not overlap the second touch lines.

9. The touch display device according to claim 8, wherein, in the area in which the first touch lines do not overlap the second touch lines, the first touch lines and the second touch lines are connected to first pads and second pads disposed on a same layer.

10. The touch display device according to claim 9, wherein, in the area in which the first touch lines do not overlap the second touch lines, the first touch lines are connected to auxiliary lines disposed on a same layer as the second touch lines.

11. The touch display device according to claim 10, wherein the auxiliary lines are connected to the first touch lines and the first pads, and
the second touch lines are connected to the second pads.

12. The touch display device according to claim 8, wherein on a boundary between the area in which the first touch lines overlap the second touch lines and the area in which the first touch lines do not overlap the second touch lines, the first touch lines are disposed on a same layer as the second touch lines and are spaced apart from the second touch lines.

13. The touch display device according to claim 12, wherein auxiliary lines are disposed on a same layer as the second touch lines, and
the auxiliary lines are connected to first pads, and the second touch lines are connected to second pads.

14. The touch display device according to claim 1, wherein each of the plurality of touch electrodes comprises a bulk transparent electrode without an open area.

15. The touch display device according to claim 1, wherein each of the plurality of touch electrodes comprises a transparent or opaque mesh-type electrode having open areas.

16. The touch display device according to claim 1, wherein the panel comprises a touchscreen panel.

17. The touch display device according to claim 1, wherein the panel includes a plurality of data lines and a plurality of gate lines such that a plurality of subpixels are arranged, and an encapsulating layer disposed on the plurality of data lines and the plurality of gate lines, and
the plurality of touch electrodes are disposed on the encapsulating layer.

18. The touch display device according to claim 17, wherein each of the first touch lines and the second touch lines is disposed between adjacent subpixels among the plurality of subpixels.

19. The touch display device according to claim 17, further comprising color filters disposed on the encapsulating layer,
wherein the plurality of touch electrodes are disposed between the encapsulating layer and the color filters.

20. The touch display device according to claim 19, further comprising an overcoat layer disposed on the color filters,
wherein the plurality of touch electrodes are disposed on the overcoat layer.

21. A touch display device comprising:
a panel on which a plurality of touch electrodes are disposed; and
a touch sensing circuit configured to supply a touch driving signal to at least one touch electrode among the plurality of touch electrodes, and sense at least one of a touch and a touched position based on a signal detected using the touch electrode to which the touch driving signal is applied,
wherein the plurality of touch electrodes are respectively connected to the touch sensing circuit through at least one touch line,
the plurality of touch electrodes comprise first touch electrodes and second touch electrodes, and
a portion or entirety of each of first touch lines connected to the first touch electrodes overlaps a corresponding one of second touch lines connected to the second touch electrodes, wherein the panel comprises an active area and a pad part disposed outside of the active area, a part of the pad part comprises an area in which the first touch lines overlap the second touch lines, and wherein, in an area in which the first touch lines do not overlap the second touch lines, the first touch lines are connected to auxiliary lines disposed on a same layer as the second touch lines.

* * * * *